(12) United States Patent
Sato et al.

(10) Patent No.: US 11,380,817 B2
(45) Date of Patent: Jul. 5, 2022

(54) METHOD FOR MANUFACTURING LIGHT-EMITTING DEVICE

(71) Applicant: NICHIA CORPORATION, Anan (JP)

(72) Inventors: Yoshiki Sato, Anan (JP); Masaaki Katsumata, Anan (JP); Shinichi Daikoku, Tokushima (JP); Yoshikazu Matsuda, Tokushima (JP); Ryuma Marume, Anan (JP); Eiko Minato, Anan (JP)

(73) Assignee: NICHIA CORPORATION, Anan (JP)

( * ) Notice: Subject to any disclaimer, the term of this patent is extended or adjusted under 35 U.S.C. 154(b) by 222 days.

(21) Appl. No.: 16/774,614

(22) Filed: Jan. 28, 2020

(65) Prior Publication Data

US 2020/0243711 A1 Jul. 30, 2020

(30) Foreign Application Priority Data

Jan. 29, 2019 (JP) .............................. JP2019-013385
Mar. 5, 2019 (JP) .............................. JP2019-039687
(Continued)

(51) Int. Cl.
*H01L 33/00* (2010.01)
*H01L 25/075* (2006.01)
(Continued)

(52) U.S. Cl.
CPC ...... *H01L 33/0095* (2013.01); *H01L 25/0753* (2013.01); *H01L 2933/0016* (2013.01);
(Continued)

(58) Field of Classification Search
CPC ..... H01L 2933/0066; H01L 2933/0058; H01L 2933/0016; H01L 24/00; H01L 33/62;
(Continued)

(56) References Cited

U.S. PATENT DOCUMENTS

2017/0179344 A1 6/2017 Matsuda
2018/0033934 A1 2/2018 Matsuda et al.
(Continued)

FOREIGN PATENT DOCUMENTS

JP 2001-076569 A 3/2001
JP 2003-209338 A 7/2003
(Continued)

*Primary Examiner* — Marcos D. Pizarro
*Assistant Examiner* — Antonio B Crite
(74) *Attorney, Agent, or Firm* — Squire Patton Boggs (US) LLP

(57) ABSTRACT

A method for manufacturing a light-emitting device includes preparing an intermediate product; the product includes a light-emitting element provided with paired electrodes at a first surface and a first covering member covering the light-emitting element such that portions of surfaces of the paired electrodes are exposed. A metal paste layer is formed, continuously covering the exposed portion of the paired electrodes and the first covering member. Paired wirings are formed for preventing the paired electrodes from being short-circuited. The metal paste layer on the paired electrodes and the metal paste layer on the first covering member are irradiated with laser light to remove the metal paste layer between the paired electrodes and a portion of the metal paste layer on the first covering member.

20 Claims, 15 Drawing Sheets

(30) Foreign Application Priority Data

Mar. 26, 2019 (JP) .............................. JP2019-059486
Dec. 27, 2019 (JP) .............................. JP2019-238083

(51) Int. Cl.

| | |
|---|---|
| H01L 23/00 | (2006.01) |
| H01L 33/48 | (2010.01) |
| H01L 33/58 | (2010.01) |
| H01L 33/62 | (2010.01) |
| H01L 33/10 | (2010.01) |
| H01L 33/36 | (2010.01) |
| H01L 33/44 | (2010.01) |
| H01L 33/60 | (2010.01) |

(52) U.S. Cl.

CPC ................ *H01L 2933/0058* (2013.01); *H01L 2933/0066* (2013.01)

(58) Field of Classification Search

CPC ......... H01L 33/10; H01L 33/60; H01L 33/58; H01L 33/486; H01L 33/36; G02B 6/0091

See application file for complete search history.

(56) References Cited

U.S. PATENT DOCUMENTS

| | | |
|---|---|---|
| 2018/0090648 A1 | 3/2018 | Yuu |
| 2018/0090654 A1 | 3/2018 | Ikeda et al. |
| 2018/0182917 A1* | 6/2018 | Kuramoto ............... H01L 24/96 |
| 2018/0239193 A1* | 8/2018 | Hayashi ............ G02F 1/133603 |
| 2018/0315904 A1 | 11/2018 | Yuu |
| 2019/0049649 A1 | 2/2019 | Hayashi et al. |
| 2019/0123236 A1 | 4/2019 | Matsuda |
| 2019/0214535 A1 | 7/2019 | Yuu |

FOREIGN PATENT DOCUMENTS

| | | |
|---|---|---|
| JP | 2012-124443 A | 6/2012 |
| JP | 2016-082002 A | 5/2016 |
| JP | 2017-118098 A | 6/2017 |
| JP | 2018-018918 A | 2/2018 |
| JP | 2018-056397 A | 4/2018 |
| JP | 2018061027 | 4/2018 |
| JP | 2018-133304 A | 8/2018 |
| JP | 2019-012681 A | 1/2019 |
| WO | WO 2014/013899 A1 | 1/2014 |

\* cited by examiner

METHOD FOR MANUFACTURING LIGHT-EMITTING DEVICE

CROSS-REFERENCE TO RELATED APPLICATIONS

This application is based upon and claims the benefit of priorities from Japanese Patent Application No. 2019-013385 filed on Jan. 29, 2019, Japanese Patent Application No. 2019-039687 filed on Mar. 5, 2019, Japanese Patent Application No. 2019-059486 filed on Mar. 26, 2019, and Japanese Patent Application No. 2019-238083 filed on Dec. 27, 2019; the entire contents of these applications are incorporated herein by reference.

BACKGROUND

1. Field

Embodiments of the present invention relate to a method for manufacturing a light-emitting device.

2. Description of Related Art

A small light-emitting device is known, in which an encapsulating member containing a reflecting material covers the lateral and lower surfaces of a light-emitting element instead of a housing for accommodating the light-emitting element and in which plated electrodes are arranged in contact with the lower surfaces of bump electrodes of the light-emitting element and the lower surface of the encapsulating member (for example, Japanese Unexamined Patent Application Publication No. 2012-124443).

A method for manufacturing a light-emitting device is known that includes forming a metal layer continuously covering paired electrodes and a covering member and removing a portion of the metal layer by irradiation with laser light (for example, Japanese Unexamined Patent Application Publication No. 2017-118098).

SUMMARY

An object of embodiments of the present invention is to provide a method for manufacturing a small and reliable light-emitting device.

According to one aspect of the present invention, a method for manufacturing a light-emitting device includes a step of preparing an intermediate product including a light-emitting element provided with paired electrodes at a first surface and a first covering member covering the light-emitting element such that portions of surfaces of the paired electrodes are exposed, a step of forming a metal paste layer continuously covering the exposed portion of the paired electrodes and the first covering member, and a step of forming paired wirings for preventing the paired electrodes from being short-circuited by irradiating the metal paste layer on the paired electrodes and the metal paste layer on the first covering member with laser light to remove the metal paste layer between the paired electrodes and a portion of the metal paste layer on the first covering member.

BRIEF DESCRIPTION OF THE DRAWINGS

A more detailed evaluation of embodiments of the invention and many of the accompanying advantages thereof will be given in the detailed description referring to the following drawings.

DETAILED DESCRIPTION OF EMBODIMENTS

Figure 1A:
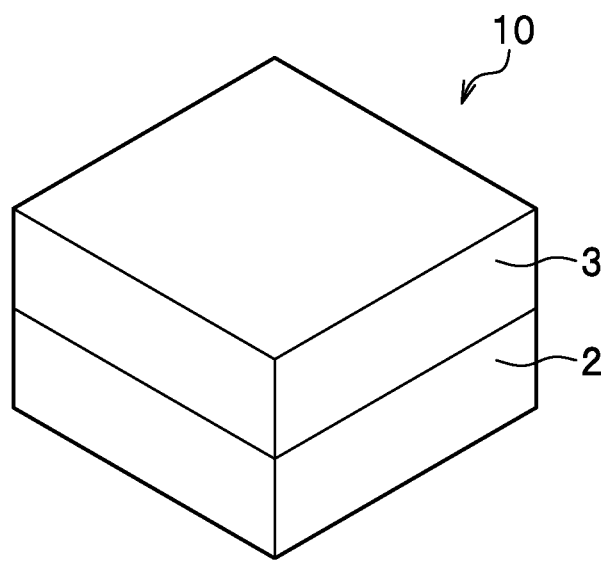
FIG. 1A is a schematic perspective view of a package according to an embodiment of the present invention.

Embodiments of the present invention will be described in detail on the basis of the accompanying drawings. The descriptions below include terms indicating specific directions or positions (such as "up", "down", "right", "left", and other terms containing the meanings of these terms) as appropriate. Use of these terms is, however, intended to facilitate understanding of the invention referring to the drawings, and the meanings of these terms do not limit the technical scope of the present invention. Portions with the same reference numeral in a plurality of drawings represent the same portion or member. The same names are used to describe resin members such as a first light-transmissive member, a second light-transmissive member, and a covering member regardless of whether or not the members have been formed, solidified, cured, or singulated. That is, the same name is used to describe such a member of which state changes depending on stages in the process as to be in a liquid body before forming, be in a solid body after forming, and be a solid body having a different shape through division of the formed body.

Figure 1B:
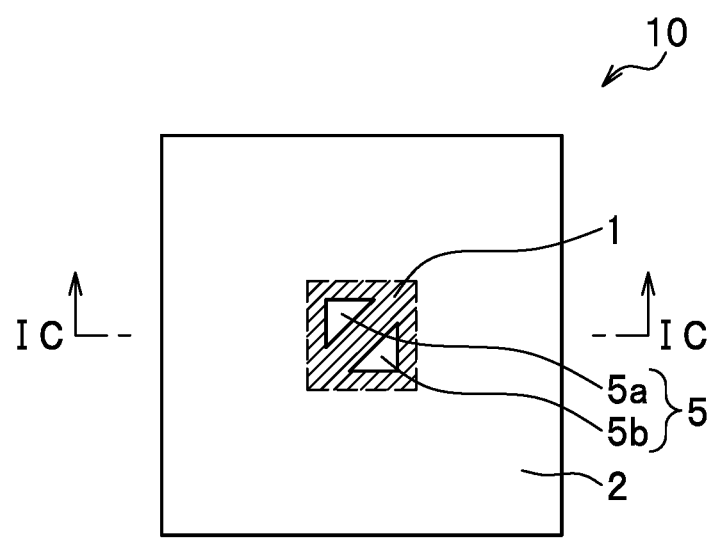
FIG. 1B is a schematic bottom view of the package according to the embodiment.
Figure 1C:
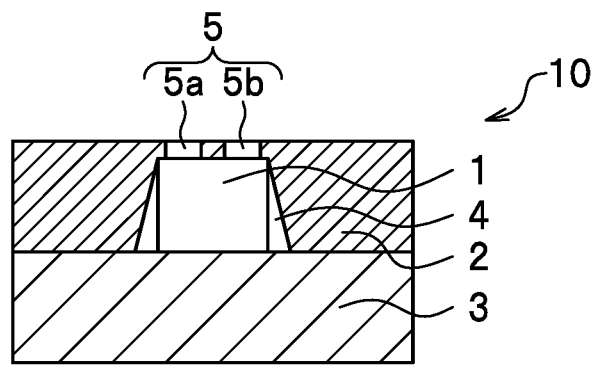
FIG. 1C is a schematic cross-sectional view of the package according to the embodiment.
Figure 2A:
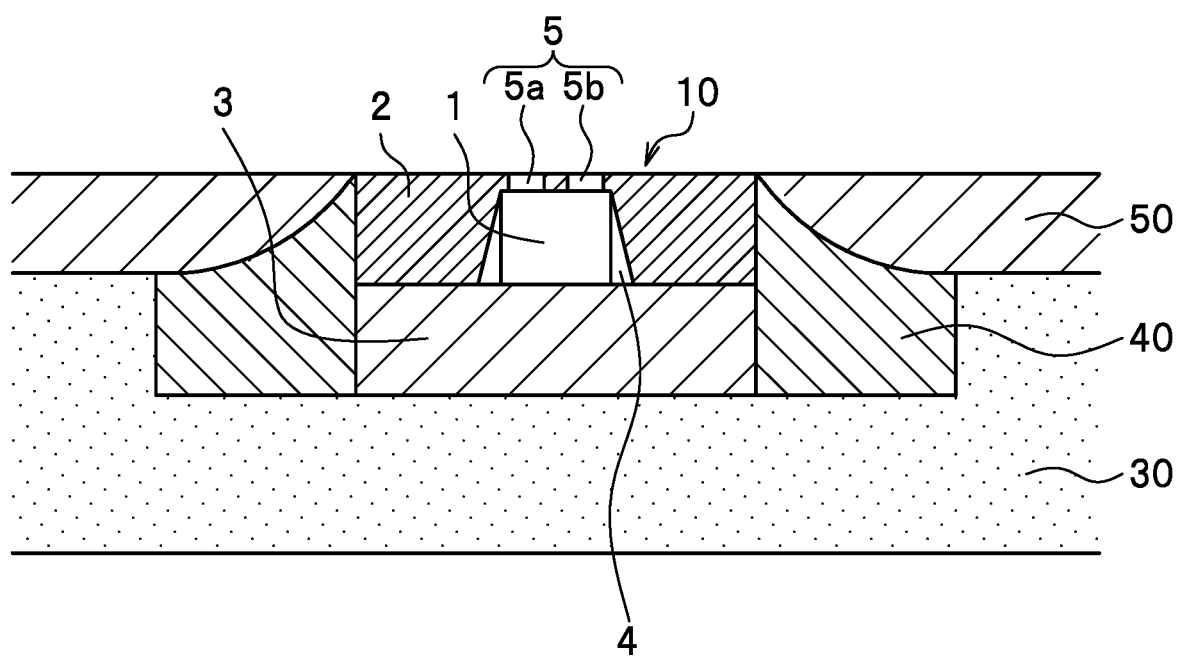
FIG. 2A is a schematic cross-sectional view showing a method for manufacturing a light-emitting device according to the embodiment.
Figure 2B:
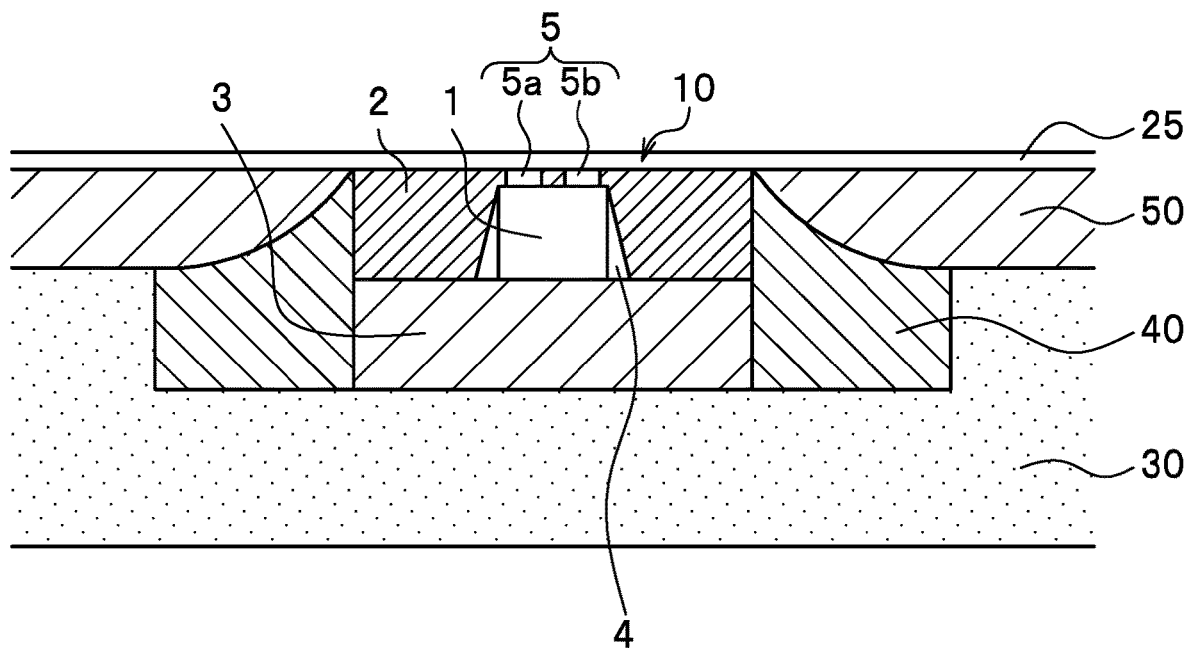
FIG. 2B is a schematic cross-sectional view showing the method for manufacturing a light-emitting device according to the embodiment.
Figure 2C:
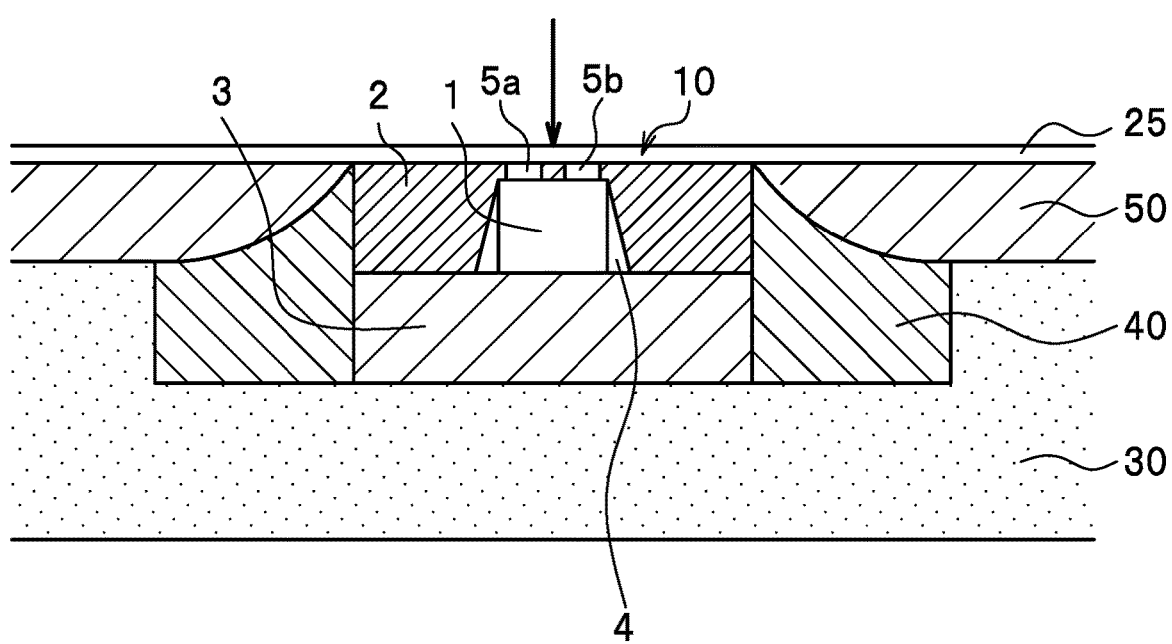
FIG. 2C is a schematic cross-sectional view showing the method for manufacturing a light-emitting device according to the embodiment.
Figure 2D:
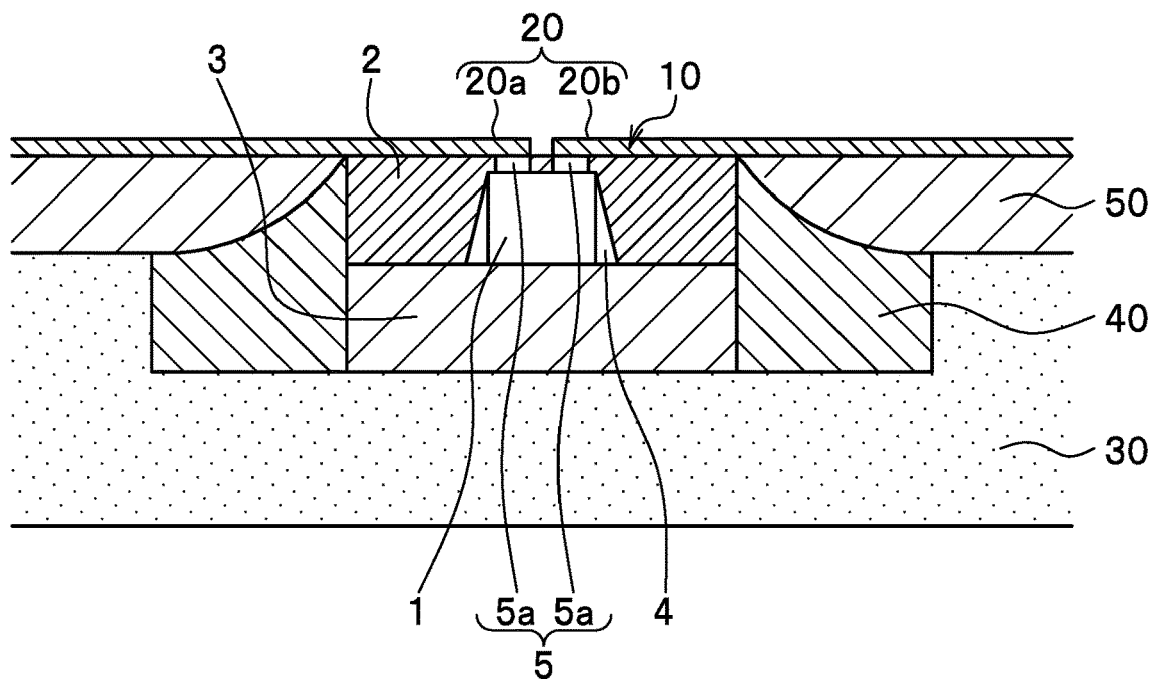
FIG. 2D is a schematic cross-sectional view showing the method for manufacturing a light-emitting device according to the embodiment.
Figure 2E:
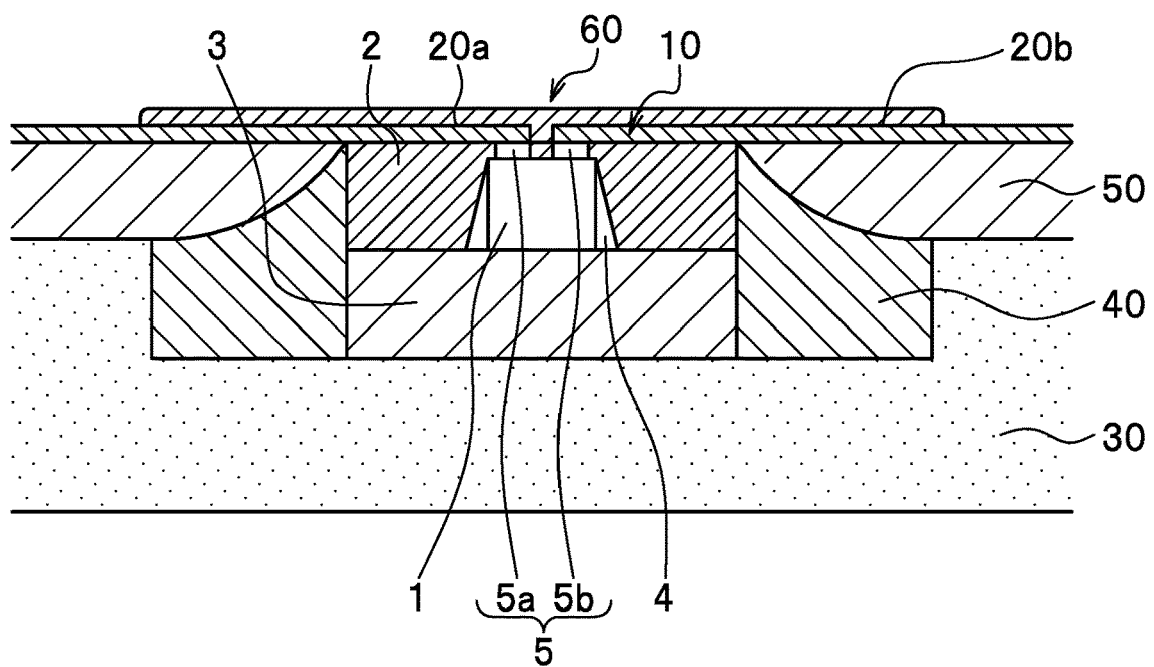
FIG. 2E is a schematic cross-sectional view showing the method for manufacturing a light-emitting device according to the embodiment.
Figure 3A:
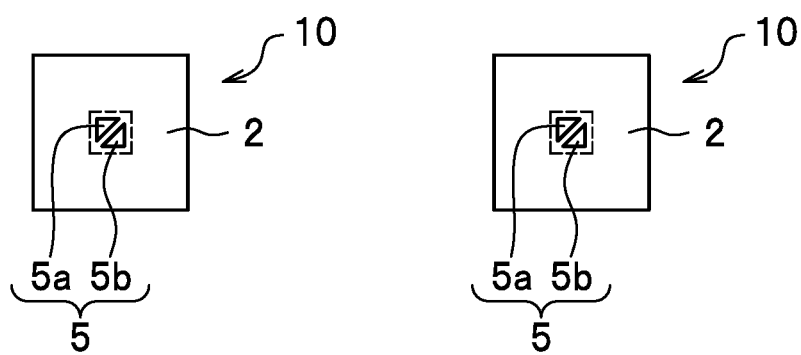
FIG. 3A is a schematic bottom view showing the method for manufacturing a light-emitting device according to the embodiment.
Figure 3B:
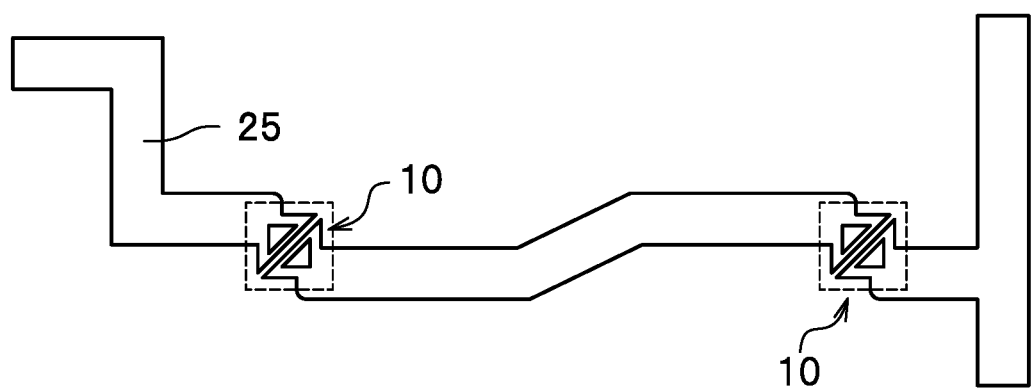
FIG. 3B is a schematic bottom view showing the method for manufacturing a light-emitting device according to the embodiment.
Figure 3C:
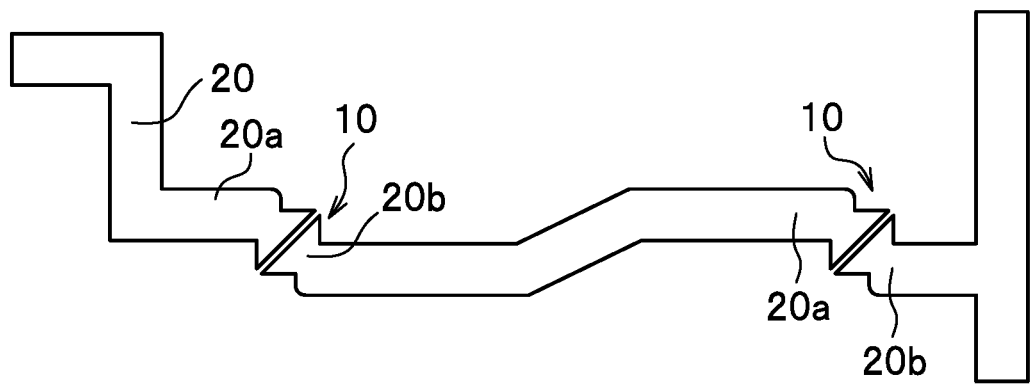
FIG. 3C is a schematic bottom view showing the method for manufacturing a light-emitting device according to the embodiment.
Figure 3D:
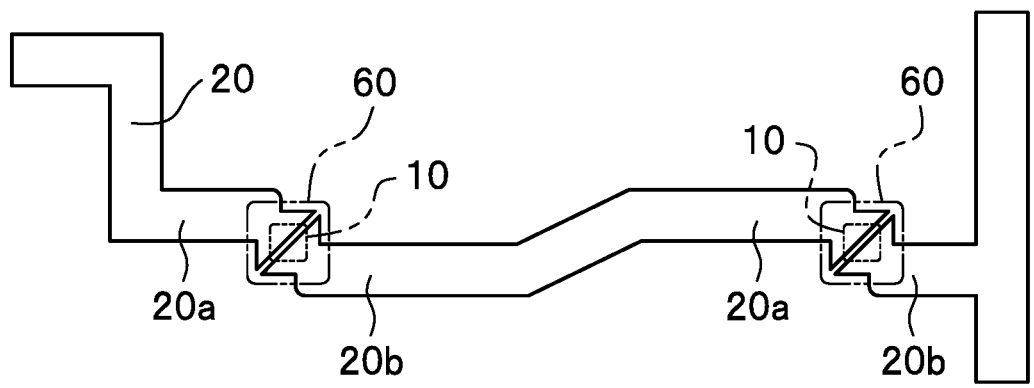
FIG. 3D is a schematic bottom view showing the method for manufacturing a light-emitting device according to the embodiment.

FIG. 1A to FIG. 1C show a package 10 according to an embodiment. FIG. 1A is a schematic perspective view of the package according to the embodiment from above. FIG. 1B is a schematic bottom view of the package according to the embodiment. FIG. 1C is a schematic cross-sectional view of the package according to the embodiment taken along the line IC-IC of FIG. 1B. The package 10 will be described as an example of an intermediate structure, but various forms are possible so far as a light-emitting element 1 and a first covering member 2 are included.

The package 10 includes the light-emitting element 1, the first covering member 2, a first light-transmissive member 3, a second light-transmissive member 4, and paired electrodes 5. The shape of the package 10 is a rectangular body, but any shapes may be employed. In a plan view, the light-emitting element 1 may have a rectangular shape but may have a polygonal shape such as a triangular shape, a pentagonal shape, or a hexagonal shape. For example, the light-emitting element 1 includes a first semiconductor layer, an active layer, and a second semiconductor layer on a substrate, wherein a portion of the active layer and a portion of the second semiconductor layer are removed. The light-emitting element 1 has a first surface and a second surface opposite to the first surface and includes the paired electrodes 5 at the first surface. The statement that "the light-emitting element 1 includes the paired electrodes 5 at the first surface" indicates that not only the case in which the electrodes are directly formed on the light-emitting element 1 but also the case in which the electrodes are indirectly formed with another member such as a semiconductor layer or metal disposed therebetween is included. The paired electrodes 5 include a first electrode 5a and a second electrode 5b with different polarities. The first electrode 5a is electrically connected to the first semiconductor layer, and the second electrode 5b is electrically connected to the second semiconductor layer. The first light-transmissive member 3 is arranged on the second surface of the light-emitting element 1. The size of the first light-transmissive member 3 may be larger than, equal to, or smaller than the second surface of the light-emitting element 1 in a plan view. In the case in which the size of the first light-transmissive member 3 is equal to or larger than the size of the second surface of the light-emitting element 1, the second light-transmissive member 4 may be arranged in the lateral sides of the light-emitting element 1. The first light-transmissive member 3 has a rectangular shape in a plan view, but a polygonal shape such as a triangular shape, a pentagonal shape, or a hexagonal shape, may be employed. The second light-transmissive member 4 preferably bonds the light-emitting element 1 to the first light-transmissive member 3. The first covering member 2 is arranged to cover the first surface and the lateral surfaces of the light-emitting element 1, the first light-transmissive member 3, and the second light-transmissive member 4 such that the surfaces of the paired electrodes 5 are exposed. The first covering member 2 may be formed in one step or in two or more steps. In case that the first covering member 2 is formed in two or more steps, it may be formed with a plurality of layers, or it may be also formed with one layer, without an interface.

Figure 4A:
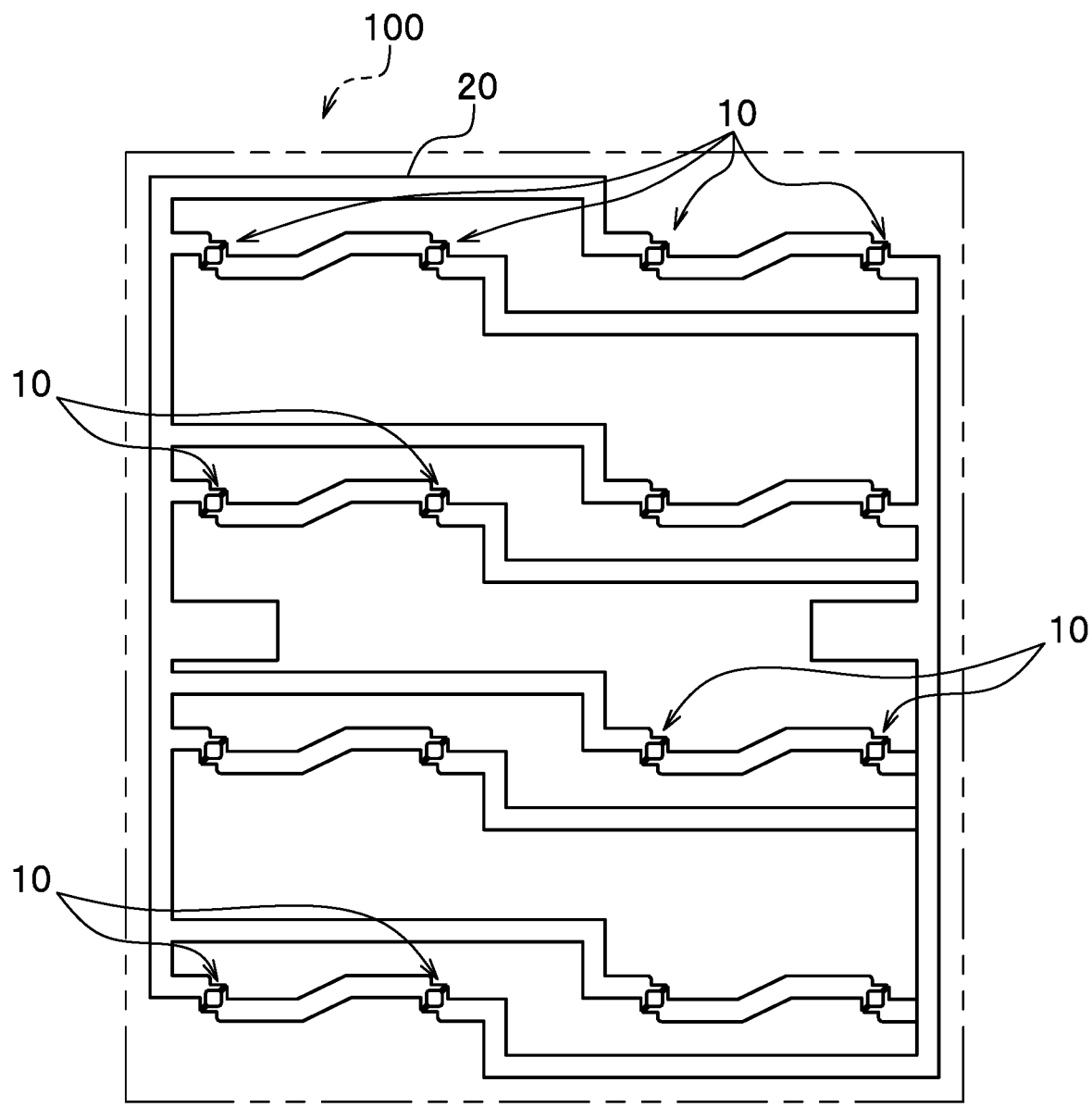
FIG. 4A is a schematic plan view of the light-emitting device according to the embodiment.
Figure 4B:
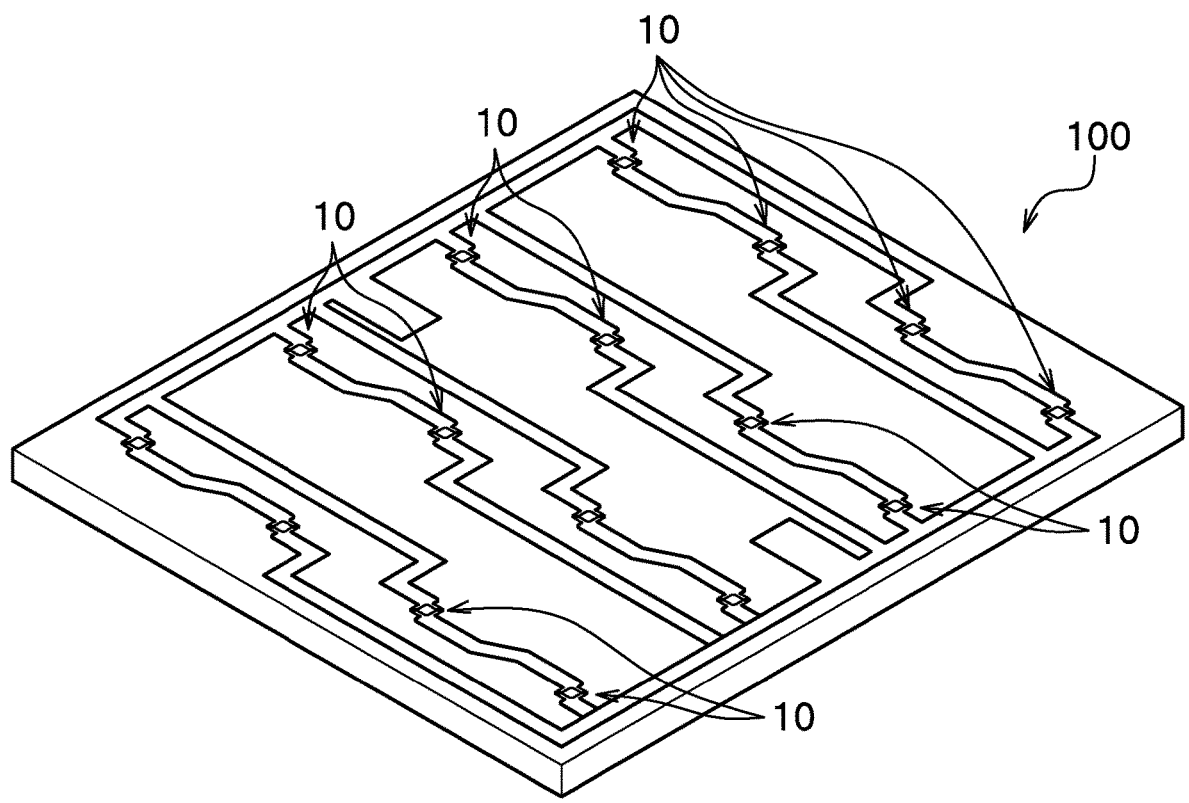
FIG. 4B is a schematic perspective view of the light-emitting device according to the embodiment.

A light-emitting device may be produced in the steps below, using the package described above. FIG. 2A to FIG. 2E are schematic cross-sectional views showing a method for manufacturing a light-emitting device according to the embodiment. Two packages are used in this example, which does not limit the present invention. A plurality of packages may be used. FIG. 3A to FIG. 3D are schematic bottom views showing the method for manufacturing a light-emitting device according to the embodiment. FIG. 4A is a schematic plan view of the light-emitting device according to the embodiment. FIG. 4B is a schematic perspective view of the light-emitting device according to the embodiment. FIG. 4A shows the state before singulation of the light-emitting device, and FIG. 4B shows the singulated light-emitting device.

The method for manufacturing a light-emitting device according to an embodiment includes a step of preparing an intermediate product including at least one light-emitting element provided with paired electrodes at a first surface and a first covering member covering the light-emitting element such that respective portions of surfaces of the paired electrodes are exposed, a step of forming a metal paste layer continuously covering the exposed portion of the paired electrodes and the first covering member, and a step of forming paired wirings by irradiating the metal paste layer on the paired electrodes and the metal paste layer on the first covering member with laser light to remove the metal paste layer between the paired electrodes and a portion of the metal paste layer on the first covering member in order to prevent the paired electrodes from being short-circuited.

A portion of the metal paste layer of the intermediate product is removed by laser ablation using a laser light irradiated to the metal paste layer. Patterning of the metal paste layer is thus conducted, and the metal paste layer can be formed into the wirings or external connection electrodes. The laser ablation is a phenomenon that the surface of a solid is removed when the radiation intensity of laser light applied to the surface of the solid reaches or exceeds a certain magnitude (threshold). Patterning of the metal paste layer can be conducted by laser ablation without using a mask or the like.

For example, in case that sputtering or vapor deposition is used for forming wirings from a metal layer, its working process is complicated and it requires sophisticated equipments, and therefore the process is costly. In addition, the metal layer is required to be thick because a thin metal layer is likely to break. However, in case that the metal layer is irradiated with laser causing ablation for forming electrodes having contacts of different materials and preventing a short circuit thereof, improvement in the working efficiency is necessary, because a thick metal layer requires a high laser power and efforts for melting and removing the metal layer.

On the other hand, in some embodiments, use of the metal paste layer enables easy and precise formation of the wirings. The metal paste layer contains a metal powder and a resin. Hence, the resin is likely to be flown off when the metal paste layer is irradiated with laser light, and therefore the laser power can be greatly reduced. The laser irradiation time can also be greatly reduced, so that the working efficiency can be greatly improved. In addition, the great improvement in the working efficiency by laser ablation allows the metal paste layer to be thick and reduces the possibility of breakage of the wiring. Furthermore, a narrow groove line can be formed by removing a portion of the metal paste layer by laser ablation, so that a smaller and reliable light-emitting device can be provided.

A plurality of packages are arranged on a light-guiding plate, and any number of packages can be employed. For example, a large number of packages may be arranged on the light-guiding plate, which is singulated into segments each containing a total of 16 packages arranged in a 4 rows×4 lines. Respective segments can be electrically connected, enabling an extendable large display, and replacement of a segment can be easily conducted segment-wise when a segment is partially gone out.

The respective steps are explained in detail below.

Preparing an Intermediate Product

An intermediate product is prepared, including light-emitting elements 1 each provided with paired electrodes 5 at a first surface and a first covering member 2 covering the light-emitting element 1 such that respective portions of surfaces of the paired electrodes 5 are exposed.

The packages 10 are placed on a light-guiding plate 30. The packages 10 are preferably arranged on the light-guiding plate 30 with adhesive third light-transmissive members 40 disposed therebetween. The first light-transmissive members 3 of the packages 10 are preferably in contact with the light-guiding plate 30. The third light-transmissive members 40 preferably cover the lateral surfaces of the first light-transmissive members 3 and the lateral surfaces of the first covering members 2. This allows light emitted from the light-emitting elements 1 to spread out in the lateral direction. It is preferable that a plurality of packages 10 be systematically arranged on the light-guiding plate 30 in the longitudinal and lateral directions. It is preferable that the packages 10 arranged on the light-guiding plate 30 are laterally covered with a second covering member 50. The thickness of the second covering member 50 is preferably smaller than the thickness of the package 10, but the thickness of the second covering member 50 may be equal to or larger than the thickness of the package 10. This is for ease of formation of a metal paste layer 25 or the wirings 20. The paired electrodes 5 preferably contain Cu because Cu has good electrical conductivity.

A flat plate may be used as the light-guiding plate 30, and recesses in which the packages 10 are to be arranged may be formed in a portion of the flat plate. The shape of each of the recesses is preferably rectangular in a plan view and similar to the shape of the package 10, but a polygonal shape such as a triangular shape, a pentagonal shape, or a hexagonal shape, may be employed. The depth of the recess may be equal to or smaller than the height of the package 10. If the depth of the recess is smaller than the height of the package 10, a portion of the package 10 is projected from the light-guiding plate 30 in a cross-sectional view. In this case, the lateral surfaces of the package 10 may be covered with the second covering member 50.

The distance between adjacent light-emitting elements 1 can be selected as appropriate depending on the intended size of the light-emitting device 100 and the size of the light-emitting elements 1. The light-emitting elements 1 are arranged taking the cut margine (width of a cutting blade) into account, because singulation is performed later by cutting the covering member.

The first covering member 2 is arranged between the paired electrodes 5 on the first surface of each light-emitting element 1. The distance between the paired electrodes 5 is preferably 10 μm or more, particularly preferably 20 μm or more. The distance between the paired electrodes 5 is preferably 100 μm or less, particularly preferably 50 μm or less. This structure facilitates formation of the paired wirings by irradiation with laser light described later, so that small packages 10 can be used. The distance between the electrodes 5 is preferably set according to a spot size of the laser light, and, preferably, the distance is small to an extent such that a short circuit is not caused.

Forming Metal Paste Layer

A metal paste layer is formed to continuously cover the pairs of electrodes 5 exposed and the first covering members 2.

A plurality of packages 10 are respectively arranged on the light-guiding plate 30 with a third light-transmissive member 40 disposed therebetween, and the second covering member 50 is arranged laterally to the package 10. The metal paste layer 25 is continuously arranged over the first covering members 2 and the second covering member 50. The metal paste layer 25 is preferably formed by either printing or spray coating. Printing can be performed by either gravure printing, relief printing, planographic printing, or screen printing, preferably screen printing. Spray coating can be performed by any of inkjet, air spray coating, or jet spray coating. The metal paste layer 25 and therefore the wirings 20 can be easily formed without requiring sophisticated equipment for sputtering or vapor deposition. The thickness of the metal paste layer 25 is preferably 1 μm or more, more preferably 3 μm to 50 μm, and particularly preferably 5 μm to 20 μm. Through arranging the metal paste layer 25 to have a predetermined thickness or more, the electrical continuity can be ensured, so that the reliability can be improved. If the metal paste layer 25 has a predetermined thickness, the electric resistance can be reduced. Even in case that the metal paste layer 25 has a predetermined thickness as described above, the wirings 20 can be easily formed by laser ablation. The width of the metal paste layer 25 is not particularly important so far the electrical continuity is ensured. For example, the width is preferably 200 μm to 1,000 μm, particularly preferably 400 μm to 700 μm.

It is preferable that, in the step of preparing an intermediate product, a plurality of light-emitting elements 1 are used, then in the step of forming a metal paste layer 25, the metal paste layer 25 is formed continuously covering the light-emitting elements 1, and then the light-emitting elements 1 are electrically connected in the step of forming the wirings 20, as explained later. The light-emitting elements 1 can thus be easily wired.

The metal paste layer 25 used here is preferably a mixture of a resin and metal powder, which may further contain an organic solvent. The size of the metal powder particle is preferably 0.01 μm to 10 μm, particularly preferably 0.1 μm to 5 μm. The electrical conductivity can be varied by controlling the particle size of the metal powder used in the metal paste layer 25. When the metal paste layer 25 is printed, its viscosity may be adjusted. The resin may be in powder or in liquid before the metal paste layer 25 is cured.

The metal powder preferably includes at least one of silver powder, copper powder, and silver or copper powder coated with a metal. The electrical conductivity can therefore be enhanced.

The concentration of the metal powder in the metal paste layer 25 is preferably between 60 wt % and 95 wt %. By increasing the concentration of the metal powder, the electrical conductivity can be enhanced, and the electric resistance can be kept low. By setting the proportion in a predetermined range, printing or the like can be easily performed.

Forming Paired Wirings

The metal paste layer 25 continuously covering the paired electrodes 5 and the first covering member 2 is irradiated with laser light to remove the metal paste layer 25 between the paired electrodes 5 and a portion of the metal paste layer 25 on the first covering member 2 to form paired wirings 20, first wiring 20*a*, second wiring 20*b*, so that short-circuiting of the paired electrodes 5 is prevented. The first wiring 20*a* and the second wiring 20*b* are formed from the metal paste layer 25 by cutting a portion of the metal paste layer 25, and not made of a material different from the material of the metal paste layer. Further, removing the portion of the metal paste layer 25 by irradiation with laser light, the metal paste layer 25 is cut between the paired electrodes 5 of a light-emitting element 1, which results in paired wirings 20, the first wiring 20*a* and the second wiring 20*b*, though they are still continuous with the metal paste layer 25 covering the electrodes of another adjacent light-emitting element 1. In other words, if the metal paste layer 25 is cut between the electrodes 5 of one light-emitting element 1 and remains continuous between the electrodes 5 of one light-emitting element 1 and the electrode 5 of another light-emitting element 1, the metal paste layer 25 does not function as the wiring 20 for simultaneous driving of two light-emitting elements.

For example, the first wiring 20*a* and the second wiring 20*b* may also be formed so that one wiring 20 drives two light-emitting elements simultaneously (FIGS. 3A-3D). The metal paste layer 25 is formed by printing or spray-coating, and by curing the resin contained in the metal paste layer 25. Heating or laser irradiation can be employed for curing. The cured metal paste layer 25 is irradiated with laser light. Pulsed irradiation of laser light is preferable, and the spot size of laser light is appropriately adjusted. The number of pulses is preferably one to ten, particularly preferably two to five. By employing a larger thickness of the metal paste layer 25, the electrical conductivity can be increased and the electric resistance can be reduced, though the number of pulses should be increased in order to cut the metal paste layer 25 for preventing the first electrode 5*a* and the second electrode 5*b* from short-circuiting. Increasing the number of pulses increases the time of forming the paired wirings 20, and it is therefore preferable to keep small the number of pulses. Hence, the number of pulses is preferably two to five. Though pulses may be applied successively at the same position, however, because this causes heat accumulation at the position, the laser may be preferably moved to prevent successive application of pulses at a same position, and the position may be re-irradiated with a pulse after a predetermined period of time. Use of a laser enables micromachining and keeping a high accuracy of cutting position. The intensity of the laser light, the diameter of the irradiation spot, and the moving speed between the irradiation spots can be selected in consideration of thermal conductivities of the first covering member 2 and the metal paste layer 25 and the difference in these thermal conductivities so that laser ablation occurs on the metal paste layer 25 above the first covering member 2.

The emission wavelength of the laser may be in the infrared range (for example around 1064 nm), red range (for example, around 640 nm), green range (for example, around 532 nm), or in a range shorter than green, such as blue or ultraviolet range (for example, around 355 nm). By employing a wavelength in the ultraviolet range, the generation efficiency of ablation can be improved and the high degree of mass production can be realized. Further, the pulse width of the laser can be in the orders of nanosecond, picosecond, or femtosecond. For example, a laser having a wavelength of around 532 nm in the green range and a pulse width of nanosecond order is preferably used in view of power and working efficiency.

Irradiation with laser light having a width smaller than the distance between the paired electrodes 5 is preferable. For example, when the distance between the first electrode 5*a* and the second electrode 5*b* is 30 μm, the distance of 30 μm between the first wiring 20*a* and the second wiring 20*b* can be realized using a laser with a processing width around 30 μm. Though, the laser light is preferably applied in a vertical direction at an angle of 90° with respect to surface of the metal paste layer 25 from a viewpoint of effectivity of laser energy concentration, the laser light is applied from diagonally above at an angle between 45° and 145°, preferably at an angle between 70° and 110° with respect to the surface of metal paste layer 25.

As the resin and the metal powder of the metal paste layer 25 are flown off by laser irradiation, these dusts are collected. The dust collection is preferably performed in a direction parallel to the surface of the light-guiding plate 30 or at an angle of 30° or less with respect to the surface of the light-guiding plate 30.

In forming paired wirings 20, as the first covering member 2 is disposed on the first surface of the light-emitting element 1 and between the paired electrodes 5, it is preferable that the first covering member 2 between the paired electrodes 5 is partially removed by laser light. In other words, the first covering member 2 disposed between the paired electrodes 5 is not completely removed by laser light but is partially left. As the first covering member 2 is insulating, the remaining first covering member 2 prevents the first wiring 20*a* and the second wiring 20*b* from being short-circuited. Preferably, the thickness of the remaining first covering member 2 is ⅕ to ⅘ of the thickness of the electrodes 5.

The method of laser irradiation is described. A plurality of light-emitting elements 1 are arranged in the row and column directions on the light-guiding plate 30. On the light-emitting elements 1, the metal paste layer 25 with a predetermined width is disposed. Laser light is applied between the pairs of electrodes 5 of a light-emitting element 1. As the light-emitting element 1 is arranged at predetermined positions, laser irradiation between the pairs of electrodes 5 can be performed even though the pairs of electrodes 5 of the light-emitting elements 1 cannot be visually recognized directly. In this case, it is preferable that the distance between the paired electrodes 5 is about 1.5 times to 5 times larger than the spot size of the laser light in consideration of positional deviations of laser irradiation.

In another method, it is preferable that the paired electrodes 5 of a light-emitting element 1 are first recognized in the step of preparing an intermediate product, and, in the step of forming paired wirings, laser light is applied between the paired electrodes 5 of the light-emitting element 1 recognized in the step of preparing the intermediate product. If the positions of the paired electrodes 5 of the light-emitting element 1 are recognized in advance as explained above, because the laser light can be applied to appropriate positions taking the positional shifts of the light-emitting element 1 in up/down direction and rotation of the light-emitting element 1 into account, a small light-emitting element 1 in which the distance between the paired electrodes 5 is small can be employed.

After forming the paired wirings, a step of covering at least the paired electrodes 5 with an insulating member 60 may be further included. The paired electrodes 5 may be occasionally exposed by laser ablation in some cases, but the short circuit can be prevented by covering the paired electrodes 5 with the insulating member 60. The insulating member 60 may cover not only the paired electrodes 5 but also the paired wirings 20 and the second covering member 50. In the step of covering paired electrodes 5 with the insulating member 60, the insulating member 60 is preferably colored. Though the insulating member 60 may be transparent, translucent, or opaque, it is preferable that the insulating member 60 is visually transparent or translucent, or transparent or translucent in the wavelength range used in a measuring instrument, for checking the state of connection between the wirings 20. The measuring instrument is preferably a spectrophotometer utilizing light such as blue light with a peak wavelength of 480 nm, green light with a peak wavelength of 520 nm, or red light with a peak wavelength of 600 nm, but it is not limited to these wavelengths. Though the insulating member 60 is preferably colorless and transparent, in particular, it is preferable to be colored in a certain extent allowing for confirmation that the insulating member 60 is arranged on the first covering member 2 and the like and for checking the state of connection between the wirings portions 20 through the insulating member 60. For example, the insulating member 60 preferably contains a coloring agent, a colorant, a pigment, or a dye of a color such as blue, green, or red. For example, the light transmission of the insulating member 60 may be 20% to 95%, preferably 30% to 80%. The light transmission of the insulating member 60 is measured with a transmission measuring instrument. The insulating member 60 is preferably a film-like, and the thickness of the insulating member 60 is preferably 0.5 μm to 100 μm. For example, the insulating member 60 preferably has a circular, elliptic, or rectangular shape having a size with a maximum diameter 0.5 to 3 times as large as the maximum diameter of the package 10.

Package

The package 10 includes at least a light-emitting element 1 and a first covering member 2 and may further include a first light-transmissive member 3 and a second light-transmissive member 4. The light-emitting element 1 includes paired electrodes 5 on the first surface. The first covering member 2 is only required to be insulating because the first covering member 2 covers the lateral surfaces of the light-emitting element 1. The first covering member 2 is preferably reflective but may also be light transmissive. The reflective first covering member 2 may be, for example, a member containing about 60 wt % of silica and white titanium oxide in a silicone resin and can be formed by compression molding, transfer molding, injection molding, printing, or spray coating. The first covering member can be formed plate-like and be cut into a rectangular body having a predetermined size.

A liquid second light-transmissive member 4 is applied on the plate-shaped first light-transmissive member 3 to bond each of the light-emitting elements 1. The liquid second light-transmissive members 4 are formed, being separated from one another. Each of the second light-transmissive members 4 can have any shape corresponding to the shape of the light-emitting element 1 in a plan view, for example, square, rectangle, circle, and ellipse. It should be noted that the distances between adjacent second light-transmissive members 4 can be appropriately selected according to the outer shape and to the number of packages 10 arranged at once. Further, each second light-transmissive member 4 is preferably formed to cover about 70% to 150% of the area covered by the package 10 in the plate-shaped first light-transmissive member 3.

When the light-emitting element 1 is arranged on the first light-transmissive member 3 applied with the liquid second transmissive member 4, the second light-transmissive member 4 creeps up the lateral surfaces of the light-emitting element 1. Accordingly, in the state in which the light-emitting element 1 is placed on the first light-transmissive member 3, the outer surfaces of the second light-transmissive member 4 is formed extending obliquely upward. For example, the second light-transmissive member 4 and the light-emitting element together formed a truncated square pyramid. The light-emitting element 1 may be pressed as necessary after being arranged on the first light-transmissive member 3. After arranging the light-emitting element 1, the liquid second light-transmissive member 4 is heated to form a cured second light-transmissive member 4.

It should be noted that, though the above light-emitting element 1 and first light-transmissive member 3 are bonded via the second light-transmissive member 4 existing between them, they may be directly bonded without the second light-transmissive member. Namely, after arranging the light-emitting element 1 on the first light-transmissive member 3, the liquid light-transmissive member 4 is applied around the light-emitting element 1.

Next, the package 10 is placed on the light-guiding plate 30 via a liquid third light-transmissive member 40 disposed therebetween so that the first light-transmissive member 3 to be in contact with the light-guiding plate 30. Similarly to the case of the above second light-transmissive member 4, a liquid third light-transmissive member 40 forms an outer surface extending obliquely upward to the package 10, and the third light-transmissive member is cured. The second covering member 50 is provided to integrally covers a plurality of packages 10. The second covering member 50 may be, for example, a member containing about 60 wt % of silica and white titanium oxide in a silicone resin and can be formed by compression molding, transfer molding, injection molding, printing, or spraying.

The thickness of the second covering member 50 may be reduced by a known process method so that the pairs of electrodes 5 of the light-emitting elements 1 are exposed, after the entire second covering member 50 is covered, covering the packages 10 arranged on the light-guiding plate 30, and after the second covering member 50 is cured. Thus, a light-emitting device 100 having a predetermined thickness can be obtained. Further, the surface of each paired electrodes 5 of respective packages 10 and the surface of the second covering member 50 can be flush, and thus the metal paste layer 25 can be easily printed.

The term "plate-like" here describes a member having a large area on which one or more light-emitting elements can be arranged, and this term can be replaced with other term such as sheet-like, film-like, or layer-like.

Light-Emitting Element

As a light-emitting element 1, for example, a semiconductor light-emitting element such as a light-emitting diode can be used, and a light-emitting element that can emit visible light such as blue, green, or red light can be used. The semiconductor light-emitting element includes a layered structure including a light-emitting layer and electrodes. The layered structure has the first surface on which the electrodes are formed and the second surface opposite to the first surface serving as the light-extracting surface.

The layered structure includes semiconductor layers including a light-emitting layer. Further, the layered structure may include a light-transmissive substrate such as a sapphire substrate. An example of the semiconductor layered body can include three semiconductor layers: a first conductive semiconductor layer (such as an n-type semiconductor layer), the light-emitting layer (active layer), and a second conductive semiconductor layer (such as a p-type semiconductor layer). As a semiconductor layer (an active layer) that can emit ultraviolet light or visible light in the blue to green region can be formed from, for example, a semiconductor material such as group III-V compound semiconductor. Specifically, a nitride semiconductor material such as $In_XAl_YGa_{1-X-Y}N$ (where $0 \leq X$, $0 \leq Y$, and $X+Y \leq 1$) can be used. Examples of a semiconductor layered body that can emit red light include GaAs, GaAlAs, GaP, InGaAs, and InGaAsP. The electrodes are preferably made of copper.

First Covering Member

The first covering member 2 is preferably a resin member having a main component of a thermosetting resin such as silicone resins, modified silicone resins, epoxy resins, or phenol resins.

The first covering member 2 is preferably a light-reflective resin member. The light-reflective resin refers to a resin material whose reflectance with respect to light emitted from the light-emitting element is 70% or more. For example, a white resin is preferable. The light extraction efficiency of the light-emitting device is enhanced because light that has reached the first covering member is reflected toward the light emission surface of the light-emitting device. A light-transmissive resin member may be used as the first covering member 2. In this case, a material that is same as or similar to the material used for the first light-transmissive member described later can be used for the first covering member.

As the light-reflective resin, for example, a light-transmissive resin including a light-reflective substance dispersed therein can be used. As the light-reflective substance, for example titanium oxide, silicon oxide, zirconium oxide, potassium titanate, aluminum oxide, aluminum nitride, boron nitride, and mullite are suitable. Though, for the light reflective material, a particle-like, fibrous, or flaky light-reflective substance can be used, a fibrous one is particularly preferable because an effect of reducing the thermal expansion coefficient of the first covering member can also be expected.

For example, in case that the first covering member is constituted of a resin member containing a filler such as a light-reflective substance, the resin component at the surface irradiated with laser light is removed by ablation and the filler is exposed at the surface. The irradiation spot of laser light is continuously or successively moved on the surface, so that grooves are formed in a striped pattern along the direction of movement. The grooves formed have a width of, for example, about 10 μm to 100 μm, typically 40 μm, and a depth of 0.1 μm to 3 μm, depending on the diameter of the irradiation spot of laser light.

First Light-Transmissive Member

The first light-transmissive member 3 is arranged on the second surface of the light-emitting element. For the material of the first light-transmissive member 3 resin, glass, etc. may be used. As examples for the resin, a thermosetting resin such as silicone resin, modified silicone resin, epoxy resin, or phenolic resin and thermoplastic resin such as polycarbonate resin, acrylic resin, methylpentene resin, or polynorbornene resin can be used. A silicone resin, which has a good light resistance and a good heat resistance, is particularly suitable.

The first light-transmissive member 3 may contain a phosphor as a wavelength conversion material in addition to the light-transmissive material described above. A phosphor that can be excited by light emitted from the light-emitting element is used. Examples of a phosphor that can be excited by a blue or ultraviolet light-emitting element include yttrium-aluminum-garnet phosphors activated with cerium (YAG:Ce); lutetium-aluminum-garnet phosphors activated with cerium (LAG:Ce); nitrogen-containing calcium aluminosilicate phosphors activated with europium and/or chromium ($CaO-Al_2O_3-SiO_2$:Eu, Cr); silicate phosphors activated with europium (($Sr,Ba)_2SiO_4$:Eu); nitride phosphors such as β-SiAlON phosphors, CASN phosphors, or SCASN phosphors; KSF phosphors ($K_2SiF_6$:Mn); sulfide phosphors; and quantum-dot phosphors. Light-emitting devices that emit various colors (such as a light-emitting device that emits white light) can be manufactured by combining these phosphors and blue or ultraviolet light-emitting elements.

Also, the first light-transmissive member 3 may contain various fillers and the like for purposes of adjusting the viscosity, etc.

Second Light-Transmissive Member

The second light-transmissive member 4 bonds the light-emitting element 1 to the first light-transmissive member 3. The second light-transmissive member may contain a phosphor or a filler.

The present invention is not limited to the embodiment described above. It is needless to say that any other embodiments within the scope of the present invention are possible.

Third Light-Transmissive Member

The third light-transmissive member 40 is a material having an adhesiveness. The third light-transmissive member 40 is preferably disposed so that the first light-transmissive member 3 of the package 10 and the light-guiding plate 30 are in contact to each other. The third light-transmissive member 40 preferably covers the side surfaces of the first light-transmissive member 3 and the side surfaces of the first covering member 2. Because of such construction, the light emitted from the light-emitting element 1 can spread out to side directions. The third light-transmissive member 40 can be formed from a same material as the second light-transmissive member 4.

Light-Guiding Plate

The light-guiding plate 30 is not limited to be simply a flat plate but may also have recesses and projections in portions, forming sections (cells) in the plate. The packages can be arranged in recesses. The recesses or projections may also function as lenses or the like. For example, depressions, a light-blocking film, or a reflective film may be formed such that the light-guiding plate 30 enables distinguishing between a cell with a lit-on package and a cell with a lit-off package. Further, by arranging a reflective film or a light-blocking film on the surface of the light-guiding plate opposite to the surface on which the packages are arranged, light emitted from the packages can spread out in the horizontal direction through the light-guiding plate.

Figure 5:
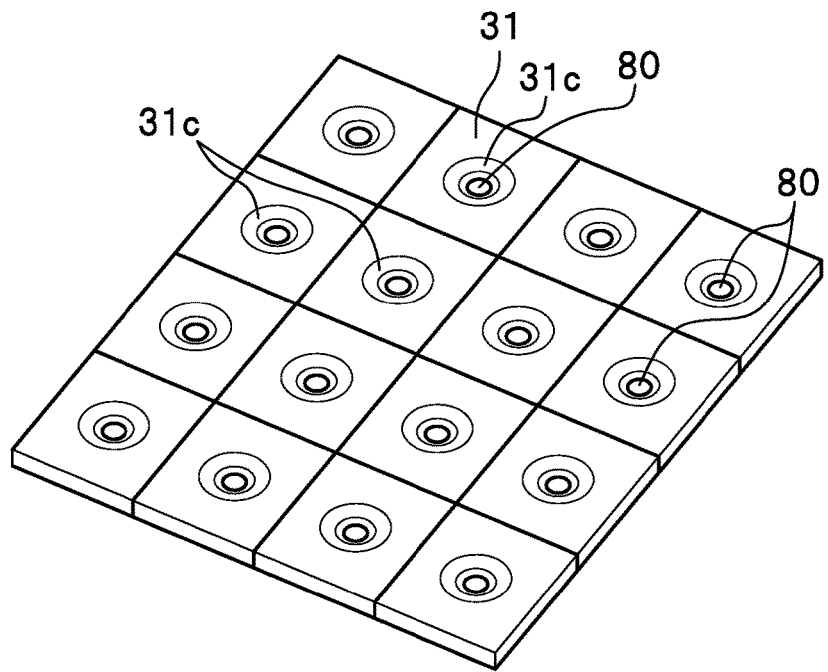
FIG. 5 is a schematic perspective view of a light-emitting device according to a second embodiment viewed from a light-guiding plate.
Figure 6:
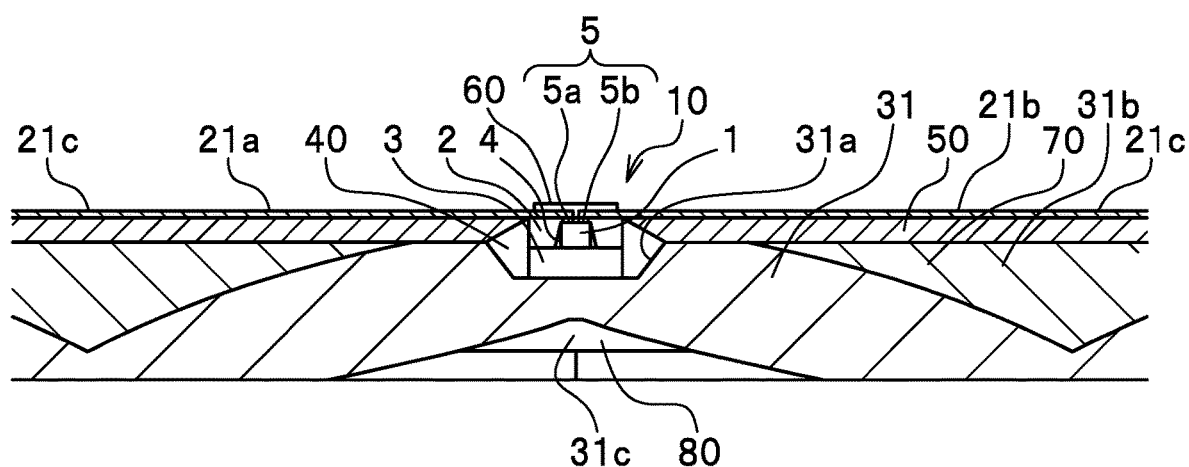
FIG. 6 is a schematic cross-sectional view of the light-emitting device according to the second embodiment.
Figure 7:
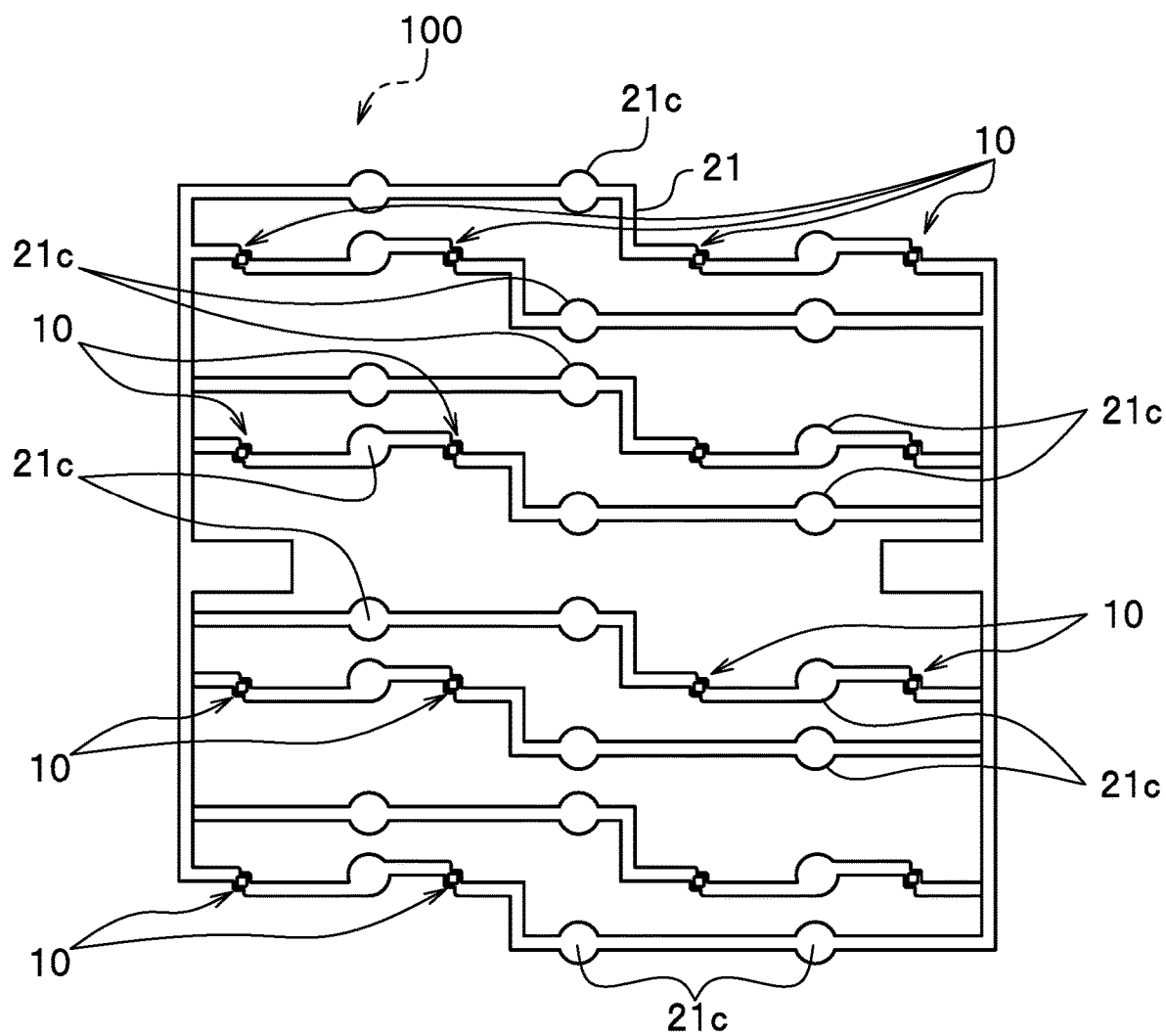
FIG. 7 is a schematic plan view of the light-emitting device according to the second embodiment.

A light-emitting device according to a second embodiment is explained referring to the drawings. FIG. 5 is a schematic perspective view of the light-emitting device according to the second embodiment viewed from the light-guiding plate. FIG. 6 is a schematic cross-sectional view of the light-emitting device according to the second embodiment. FIG. 7 is a schematic plan view of the light-emitting device according to the second embodiment. Here, in the already explained step of preparing an intermediate product, the explantion about the package 10 is given, assuming that the package 10 is arranged via the third light-transmissive member 40 on the light-guiding plate 31. In these figures, the package and the third light-transmissive member are shown for visibility without hatching which indicates cross sections of the members. The schematic perspective view of the light-emitting device according to the second embodiment shows one segment constituted of a total of 16 cells in which four cells are arranged in the longitudinal direction and four cells are arranged in the lateral direction. A plurality of segments are combined to constitute a planar light source of any desired size. The schematic cross-sectional view according to the second embodiment (FIG. 6) shows a single cell of the light-emitting device.

A pre-arranged light-guiding plate 31 is used for the light-emitting device according to the second embodiment. The surface of the light-guiding plate 31 on which the packages 10 are arranged is flat, assuming the surface opposite to the flat surface as back surface. Light from the packages 10 is emitted mainly from the back surface of the light-guiding plate 31. A single cell of the light-guiding plate 31 has a first recess 31a in a region in which the package 10 is arranged. A second recess 31b is formed between adjacent first recesses 31a of the light-guiding plate 31, and the second recess 31b is formed around an intersection point of a longitudinal line and a lateral line, forming a lattice pattern. In each package 10, the light-emitting element 1 is placed on the first light-transmissive member 3, the second light-transmissive member 4 is arranged on the lateral surfaces of the light-emitting element 1, and the first covering member 2 is arranged covering the second light-transmissive member 4. The shape of the first recess 31a is a frustum of a truncated square pyramid in a plan view and is a trapezoid in a cross-sectional view that is wider on the upper side of the opening than on the bottom surface. The opening area of the first recess 31a on the upper side of the opening is larger than the area of the bottom surface. The package 10 is arranged such that the bottom of the frustum of the truncated square pyramid and the first light-transmissive member 3 are in contact. The third light-transmissive member 40 is arranged on the lateral surfaces of the package 10. A reflective member 70 is disposed in the second recess 31b of the light-guiding plate 31. The flat surface of the upper surface of the reflective member 70 and the light-guiding plate 31 is covered with the second covering member 50. For the reflective member 70 and the second covering member 50, a resin mixed with light-reflective substances is used to efficiently reflect light emitted from the packages 10, so that the light emitted from the packages 10 is emitted from the back surface of the light-guiding plate 31. The second recess 31b has inclined surfaces to allow light easily emit from the packages 10 to be emitted from the back surface of the light-guiding plate 31, and the inclination angle is preferably such that light can be extracted in a vertical direction from the back surface of the light-guiding plate 31. Wirings 21 are arranged on the second covering member 50. A first wiring 21a is electrically connected to the first electrode 5a of the package 10, and a second wiring 21b is electrically connected to the second electrode 5b of the package 10, wherein the connecting portion of these wirings is covered with the insulating member 60. In this case, the second recess 31b is deepest between adjacent first recesses 31a, in other words, at a joint portion between cells. As the reflective member 70 is arranged in the second recess 31b, the resin used for the reflective member 70 shrinks when the resin is cured, and a curved depression is likely to be formed on the upper surface of the reflective member 70 in the second recess 31b. Thus, when the wirings 21 are provided by such as printing, because there is a risk that the wirings may likely to be broken, widened portions 21c are provided to the wirings 21 for avoiding such breakage. The wirings 21 may be fainted or narrowed when being printed, causing an increase of electric resistance even though the wirings 21 are not broken. Hence, the widened portions 21c of the wirings 21 are preferably arranged near the most depressed point of the second recess 31b and on the joint portions between cells. The shape of the widened portions 21c of the wirings 21 is not limited to be circular or elliptic but may be rectangular or polygonal, and the number thereof is not limited to one, thus a plurality of widened portions are used, or a plurality of lines can also be used in place of these widened portions. In case that a plurality of widened portions 21c are arranged on the joint portions between cells, a plurality of widened portions 21c are preferably arranged in a substantially straight line.

Third recesses 31c are preferably formed on the back surface of the light-guiding plate 31 at positions opposite to the first recesses 31a. The third recesses 31c are preferably, for example, a conical or polygonal pyramid. This is because conical third recesses 31c allow light emitted from the packages 10 to spread out in the horizontal directions or oblique directions through the light-guiding plate 31. Light-blocking members 80 may be arranged in the third recesses 31c. Because the light from the packages 10 is emitted most intensely to the direction directly upward of the package, and therefore occurs likely an emission unevenness over the whole light-guiding plate 31. Thus, by arranging the light-blocking members 80 in the third recesses 31c, the light emitted from the packages 10 directly upward can be suppressed and the emission unevenness can be reduced. Each of the light-blocking members 80 may cover the entire third recess 31c, but preferably covers only a portion of the third recess 31c. For example, it is preferable that, for example, about ¼ to ¾ of the depth of the third recess 31c is covered. The light-blocking member 80 preferably covers an area equal to or up to as large as the first recess 31a, seen in a back view of the light-guiding plate 31. The shape of the third recess 31c after arranging the light-blocking member 80 in the third recess 31c is preferably circular truncated cone in a back view.

Hence, the light-guiding plate 31 has a plurality of first recesses 31a in which the light-emitting elements 1 are arranged and the second recess 31b between adjacent first recesses 31a. The reflective member 70 is arranged in the second recess 31b, the second covering member 50 covers the reflective member 70, and the wirings 21 are arranged on the second covering member 50. The wirings 21 arranged on the second recess 31b preferably include the widened portions 21c, which are portions wider than the wirings 21 arranged on the first recesses 31a.

Figure 8:
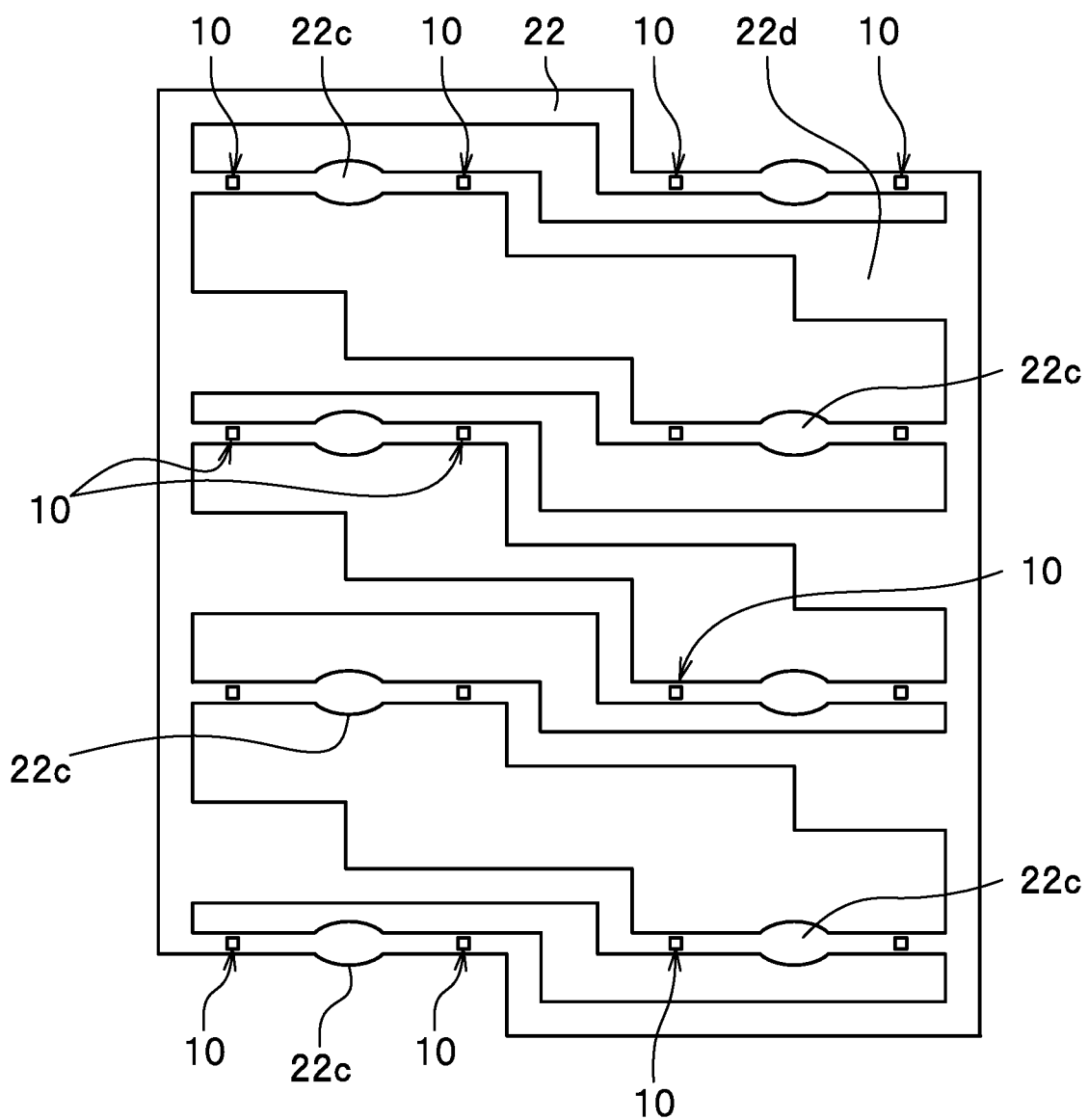
FIG. 8 is a schematic plan view of a light-emitting device according to a third embodiment.

A light-emitting device according to a third embodiment is explained referring to the drawing. FIG. 8 is a schematic plan view of the light-emitting device according to the third embodiment.

The light-emitting device according to the third embodiment is substantially same as the second embodiment except for the wirings. Wirings 22 include widened portions 22c between adjacent packages 10 arranged in the lateral direction, particularly at the middle position between adjacent packages 10. The wiring 20 is provided with a bent portion around the center of each wiring 22, being a linear-like shape having a step, in the lateral direction between adjacent packages 10, but the bent portion is not located at the middle position between the adjacent packages 10. By providing the wiring 22 with the bent portion, it is possible to prevent fainting or breaking of the wiring 22 when being printed. Further, the wiring 22 includes a widened wiring portion 22d on the side different from the side on which the packages 10 are arranged in the lateral direction. Widening the wiring 22 can reduce the electric resistance and prevent breakage. The length of the wiring portion 22d in the lateral direction is not particularly limited, but the wiring portion 22d preferably extends to the vicinity of the wide portion 22c in the up/down direction.

Figure 9:
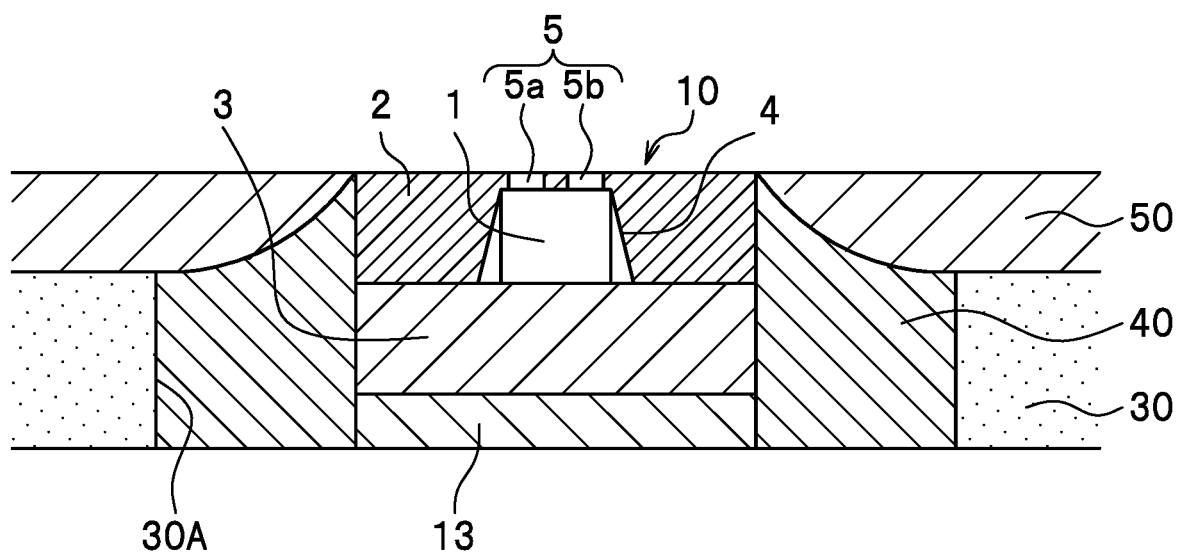
FIG. 9 is a schematic cross-sectional view of a light-emitting device according to a fourth embodiment.

A light-emitting device according to a third embodiment is explained referring to FIG. 9. FIG. 9 is a schematic plan view of the light-emitting device according to the third embodiment. Here, it is explained that, in the already explained step of preparing an intermediate product, the package 10 is assumed to be arranged via the third light-transmissive member 40 on the light-guiding plate 30. It should be noted that the light-emitting element 1 and the second light-transmissive member 4 are shown for visibility without hatching which indicates cross sections of the members.

The light-emitting device related to the fourth embodiment is different from the other embodiments in that the package 10 is arranged in a through-hole 30A provided in the light-guiding plate 30. It should be noted that a through-hole 30A is provided in the light-guiding plate 30 corresponding the respective arranged packages. The package 10 includes a light-emitting element 1, a first light-transmissive member 3 disposed via a second light-transmissive member 4 on the light-emitting element 1, a first light-reflective film 13 arranged on the first light-transmissive member 3, and a first covering member 2 provided via the second light-transmissive member 4 to the lateral sides of the light-emitting element 1. Further, the package 10 is arranged via the third light-transmissive member 40 on the light-guiding plate 30. Again, it is preferable that the second covering member 50 covers the lateral sides of the package 10 arranged on the light-guiding plate 30. Though it is preferable that the thickness of the second covering member 50 is less than the thickness of the package 10, the thickness of the second covering member 50 may be same or larger than the package 10. It should be noted that, for arranging the package 10 in the through-hole 30A formed in the light-guiding plate 30, a working sheet may be applied to cover the through-hole on one side.

Further, the first light-reflective film 13 arranged on the first light-transmissive member 3 is, as an example, formed to be flush with the surface of the light-guiding plate 30. The first light-reflective film 13 is used for reflecting or shading a light. The first light-reflective film 13 is preferably formed from a material which shades or reflects at least 80% of light transmitted via the first light-transmissive member 3. For the first light-reflective film 13, a single-layer film from a metal, a multi-layer film from a metal, or a multi-layer film consisting of a plurality of layers from at least two kinds of dielectric materials, namely a dieclectric multi-layer film, can be used. The first light-reflective film 13 can be formed by, for example, by sputtering method. In a plan view, the first light-reflective film 13 may have a same area as the first light-transmissive member 3 or may have a larger area than the first light-transmissive material 3. This is because the light emitted upwards from the light emitting element 1 can be guided to lateral side by arranging the size of the first light-transmissive member 3 larger. When the area of the first light-reflective film 13 is arranged to be larger than the area of the first light-transmissive member 3, preferably a plate-shape is employed fro the first light-reflective film 13.

Further, when the first light-reflective film is formed in advance and bonded with an adhesive, an adhesive such as aclyric, ulethane, stylene, epoxy, polyimide, silicone, BT-resin, esther, ether, uria, polyamid, phenol, cellose derivative adhesive can be used alone or in combination.

Further, when a dielectric multi-layer film is used, a DBR-film (distributed Brag reflector) can be used. For the first light-reflective film 13, above all, a film containing a dielectric multi-layer film is preferably used. With a dielectric multi-layer film, the light absorption is less compared with a reflective film formed from a metal, and thus the light can be reflected efficiently. When both a metal film and a dieclectric multi-layer film are used, the dieclectric multi-layer film and the metal film are arranged preferably in this order from the surface to be placed. Further, when a metal film is used for the first light-reflective film 13, aluminum or silver alone or an alloy of them can be used.

It should be noted that the other parts of the configuration of the light-emitting device are similar to those which are explained above already.

Figure 10A:
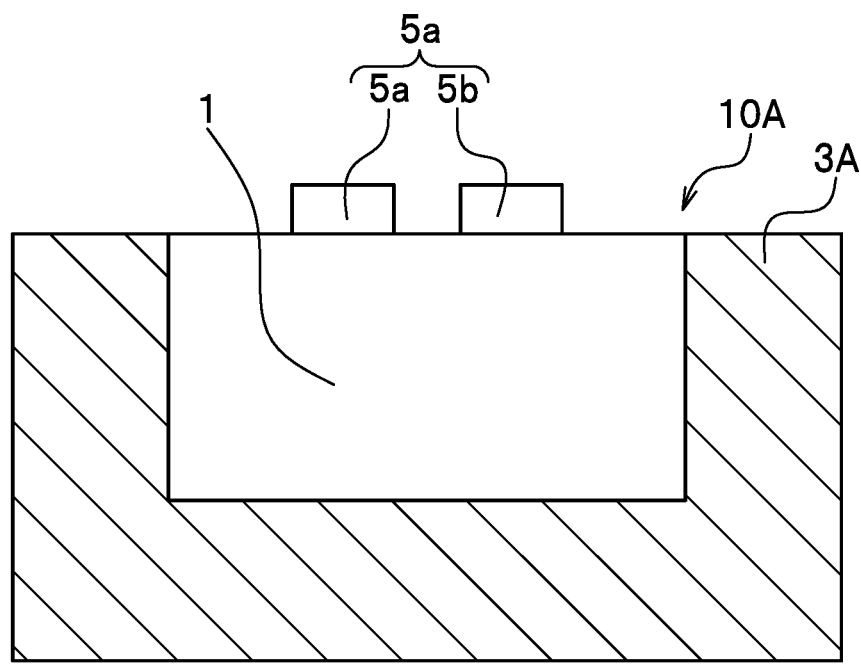
FIG. 10A is a schematic view schematically showing a variation of a package which can be employed in the respective embodiments.
Figure 10B:
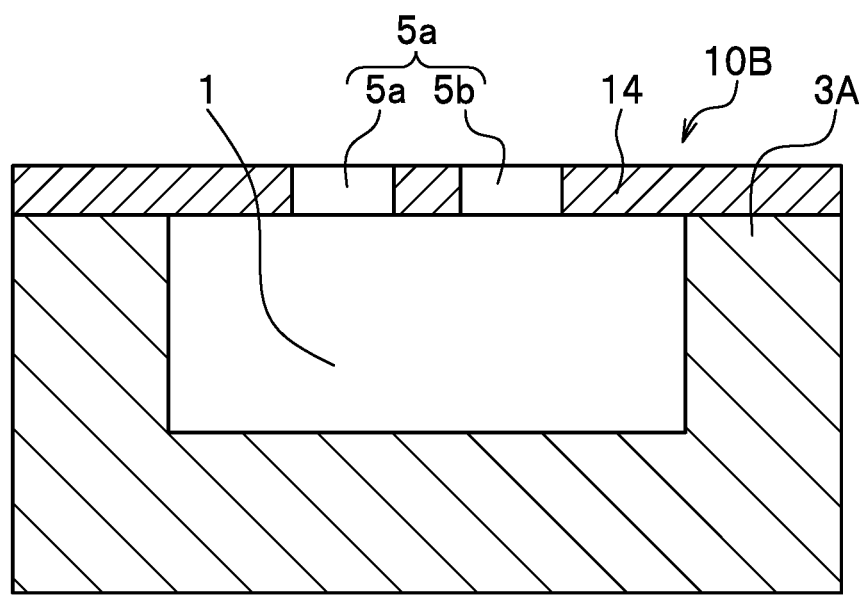
FIG. 10B is a schematic view schematically showing a variation of a package which can be employed in the respective embodiments.

Further, in the light-emitting device explained above for each embodiment, the construction of the first light-transmissive member 3 of the package 10 may be such as shown in FIGS. 10A and 10B. FIGS. 10A and 10B are schematical drawings each schematically showing a variant in each embodiment. It should be noted that the members are shown for visibility without hatching which indicates cross sections of the members.

In the package 10A, the first light-transmissive member 3A is formed in such a way that it covers the lateral surface and the second surface of the light-emitting element 1. This first light-transmissive member 3A is made of a same material as explained already. Since the first light-transmissive member 3A is formed over the second surface, which is the upper surface (lower surface in the figure) of the light-emitting element 1, and over the lateral surface, it becomes easier to transfer light from the light-emitting element 1 to a distant part of the light-guiding plate 30. Further, in the package 10B, it may be also acceptable that a second light-reflective film 14 is formed on the lower surface of the first light-transmissive member 3A arranged on the lateral side and second surface of the light-emitting element 1 and on the lower surface of the light-emitting element 1, so that the second light-reflective film 14 is formed to expose the element electrodes 5 of the light-emitting element 1. The second light-reflective film 14 may be formed employing a white resin for diffuse reflection or employing a material similar to that of the already explained second covering member. In the package 10B, the light extraction efficiency of the light-emitting element 1, which light is emitted from the side of the light-guiding plate 2, can be improved by providing the second light-reflective film 14.

It should be noted that, when any one of the packages 10A, 10B shown in FIGS. 10A, 10B is arranged on the light-guiding plate 30, the package is used in a state that the first light-reflective film 13 is arranged on the upper surface of the first light-transmissive member 3A.

Figure 11:
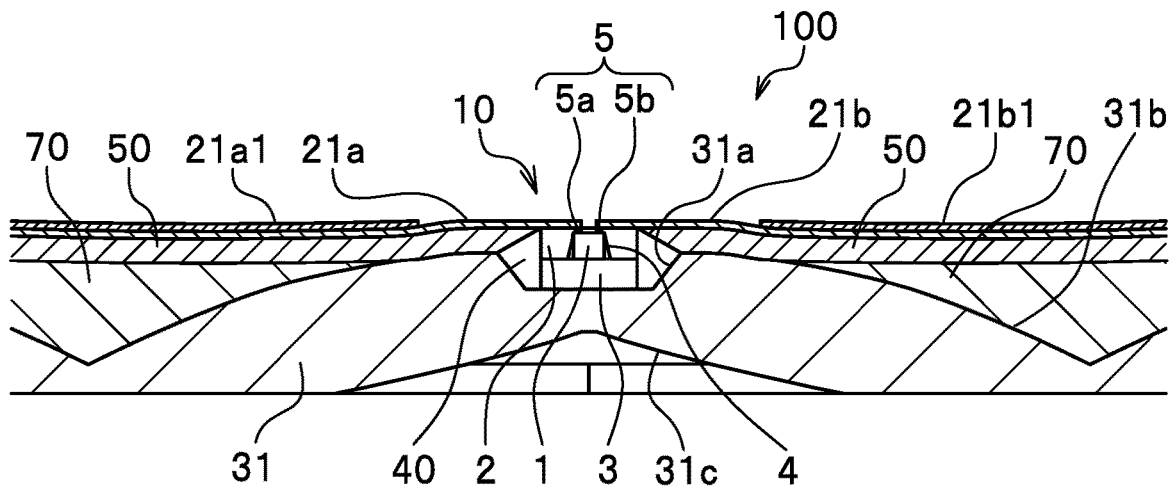
FIG. 11 is a schematic cross-sectional view related to a fifth embodiment.

Next, a fifth embodiment is explained in reference to FIG. 11. FIG. 11 is a schematic cross-sectional view related to the fifth embodiment. Here, explanations are given, assuming a condition that, in the step of preparing an intermediate product, the package 10 is arranged on the light-guiding plate 31 via the third light-transmissive member 40. In the figure, for better visibility, the hatchings showing the package and the third light-transmissive member are omitted. In the light-emitting device related to the fifth embodiment, the difference from the second embodiment shown in FIG. 6 is that a first auxiliary wiring 21a1 is formed on the first wiring 21a and that a second auxiliary wiring 21b1 is formed on the second wiring 21b. Namely, in the fifth embodiment, a sag may be occasionally formed on the surface of the second covering member 50 when one or both resin materials of the reflective member 70 and the second covering member 50 are cured and shrinked, wherein the reflective member 70 is filled in the second recess 31b which is formed on the light-guiding plate 31. Therefore, for keeping flatness, the first auxiliary wiring 21a1 is arranged on the first wiring 21a and the second auxiliary wiring 21b1 is arranged on the first wiring 21b.

Further, because a sag may be formed on the surface of the second covering member 50, there may be a risk that the first wiring 21a and the second wiring 21b are formed narrower or thinner, causing a high electrical resistance for these wirings. For avoiding this, the first auxiliary wiring 21a1 is arranged on the first wiring 21a and the second auxiliary wiring 21b1 is arranged on the first wiring 21b, which may provide a lower electrical resistance and prevent wiring disconnection.

Here, the employed first auxiliary wiring 21a1 is formed on the first wiring 21a by arranging a material of same width and same thickness as the first wiring 21a, which compensates the sag of the resin materials to be close to a flat shape. Further, also the second auxiliary wiring 21b1 is formed over the second wiring 21b by arranging a material of same width and same thickness as the first wiring 21b, compensating the recess to be close to a flat shape. It should be noted that the first auxiliary wiring 21a1 and the second auxiliary wiring 21b1 may be formed from more than 1 layer, for keeping the flatness.

Further, the first auxiliary wiring 21a1 and the second auxiliary wiring 21b1 may be formed with a width larger than those of the first wiring 21a and the second wiring 21b. In addition, the first auxiliary wiring 21a1 is formed having a length more than 50% of the length of the first wiring 21a and is formed so far that the recessed portion can be compensated to be flat. The second auxiliary wiring 21b1 is similarly formed having a length more than 50% of the length of the second wiring 21b. It should be noted that the first auxiliary wiring 21a1 and the second auxiliary wiring 21b1 may be formed having a same length or may be formed having different lengths.

The first auxiliary wiring 21a1 and the second auxiliary wiring 21b1 may be formed by printing, etc., similarly to the first wiring 21a and second wiring 21b. The first auxiliary wiring 21a1 and the second auxiliary wiring 21b1 are preferably arranged on the first wiring 21a and on the second wiring 21b, extending over the portions having a largest recess and over a connecting portion of adjacent cells.

Figure 12:
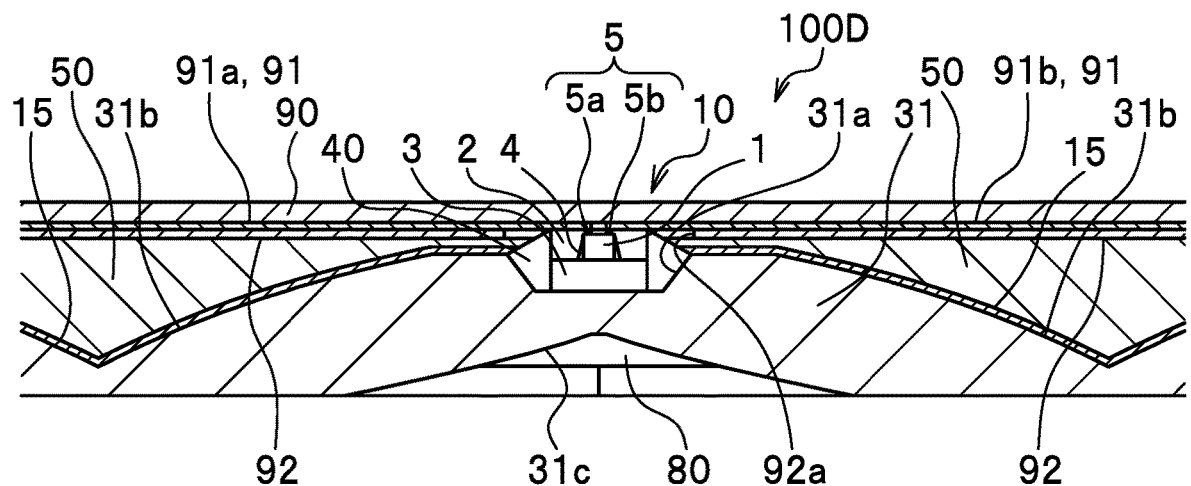
FIG. 12 is a schematic cross-sectional view related to a sixth embodiment.

Next, a sixth embodiment is explained in reference to FIG. 12. FIG. 12 is a schematic cross-sectional view related to the sixth embodiment. Here, in the step of preparing an intermediate product, explanations are given assuming a condition that the package 10 is arranged on the light-guiding plate 31 via the third light-transmissive member 40. In the figure, for better visibility, the hatchings showing the package and the third light-transmissive member are omitted. In the light-emitting device 100D related to the sixth embodiment, the difference from the second embodiment shown in FIG. 6 is that the second covering member 50 is formed in the second recess 31b of the light-guiding plate 31 and that the third light-reflective film 15 is formed on the surface opposite to the light-emitting side of the light-guiding plate 31, along the shape of the second recess 31b formed in the light-guiding plate 31.

The third light-reflective film 15 is arranged to cover a surface of one side of the light-guiding plate 31, excluding the first recess 31a. The third light-reflective film 15 is preferably formed with a material which shades or reflects at least 80% of light, for example. For the third light-reflective film 15, a single-layer film from a metal, a multi-layer film from a metal, or a multi-layer film consisting of a plurality of layers from at least 2 two kinds of dielectric materials, namely a dieclectric multi-layer film, can be used. Further, the third light-reflective film can be formed, for example, by sputtering method. For this third light-reflective film 15, a material and a forming method which are similar to the already explained first light-reflective film can be employed.

In addition, the light-emitting device 100D is formed in such a way that the second covering member 50 is filled in the second recess 31b of the light-guiding plate 31. In the light-emitting device 100D, the electrodes 5 of the light-emitting element 1 may be electrically connected via a connection substrate 90.

The connection substrate 90 includes a wiring layer 91 in the substrate and includes a covering layer 92 formed from an insulating material for protection of the wiring layer 91. The wiring substrate 90 includes the wiring layer 91 arranged on the surface of or within a flat plate-like supporting member. It should be noted that, in the structure of the wiring substrate 90, number of light-emitting elements 1 and construction of the element electrodes such as shape and size of the electrodes are determined according to the size of the light-emitting device.

For the supporting member of the wiring substrate 90, an insulating material is preferably used, and a material, which hardly transmits the emitted light from the light-emitting element 1 or the external light, is preferably used. The wiring substrate 90 may be of a material having a certain rigidity or may be of a material used for a sheet and a flexible substrate. In particular, a ceramic such as alumina, aluminium nitride, mullite, and a resin such as phenol resin, epoxy resin, polyimide resin, BT resin (bismaleimide-triazin resin), polyphthalamide (PPA) can be considered.

The wiring 91 includes a first wiring 91a electrically connected to the first electrode 5a of the package 10 and a second wiring 91b electrically connected to the first electrode 5b of the package 10. Though the positions of the formed first wiring 91a and second wiring 91b are different, their material, etc. are unchanged from the already explained wirings. Further, the wiring layer 91 is covered by a covering layer 92, excluding the positions of the electrodes 5.

The covering layer 92 is for protection of the wiring layer 91. The covering layer 92 is formed from an insulating material containing, for example, polyimide as a base material. The covering layer 92 is formed by screen printing etc. using a mask in such a way as to cover the wiring layer 91 and to provide an opening 92a on the position of the electrode 5.

It should be noted that the wiring layer 91 of the wiring substrate 90 is formed before electrical connections of the first and second electrodes 5a, 5b of the package 10, namely formed in the step of forming paired wirings for avoiding short circuiting of the connections.

Because the light-emitting device 100D includes the above explained construction, owing to the third light-reflective film 15, the light-emitting device can be used without deterioration of irradiation efficiency of light from the light-guiding plate 31.

Figure 13:
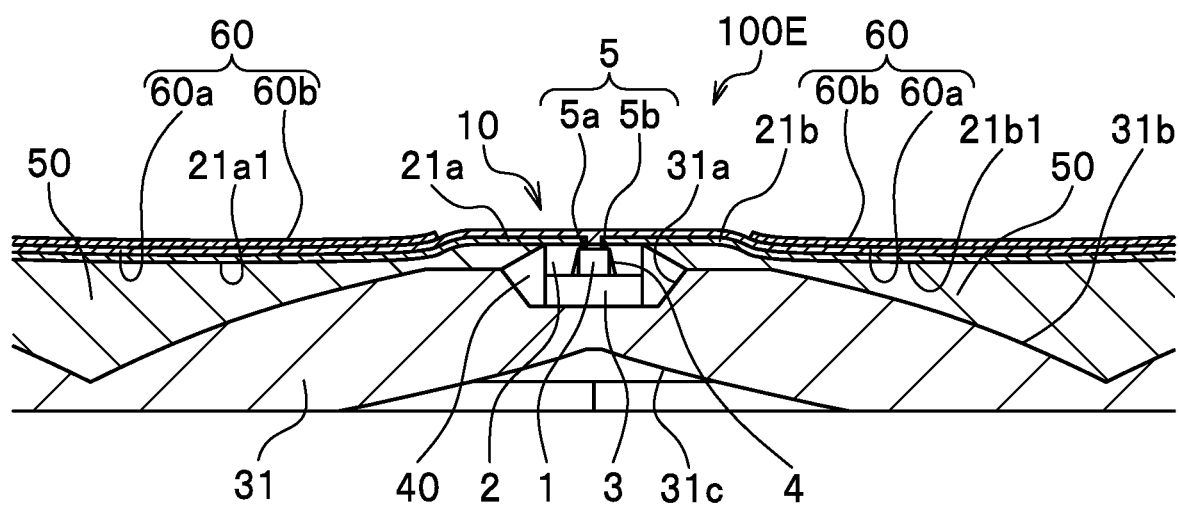
FIG. 13 is a schematic cross-sectional view related to a seventh embodiment.

Next, a seventh embodiment is explained in reference to FIG. 13. FIG. 13 is a schematic cross-sectional view related to the seventh embodiment. It should be noted that, for the already explained construction elements, same numbers are given to them and their explanations are omitted. Further, here, in the step of preparing an intermediate product, explanations are given assuming a condition that the package 10 is arranged on the light-guiding plate 31 via the third light-transmissive member 40. Further, it is assumed that the first wiring 21a and the second wiring 21b are formed in the step of forming paired wirings in such a way that a wiring portion formed from a metal paste layer is irradiated with a laser light to remove the metal paste layer partially. In the light-emitting device 100E related to the seventh embodiment, the difference is in that the two layers of the insulating member 60 are provided to flatten a recess occurring in the second covering member 50.

Namely, in the light-emitting device 100E, the flatness can be assured by covering the recess portion in the second covering member 50 by use of two layers, a insulating layer 60a and an auxiliary insulating layer 60b. Owing to this construction, in the light-emitting device 100E, it can be facilitated to compensate the precision of applications of respective member and to improve the working efficiency per hour. The auxiliary insulating film 60b is not limited to one layer and may be more than one layer. Further, it is sufficient if the insulating film 60a covers at least a part of the second covering member 50 and the pair of wirings 21. For example, the insulating film 60a is formed in the condition that the portions of electrical connections of the paired wirings 21 is opened.

It should be noted that, in the first through seventh embodiments, by virtue of the drawings, the figures indicating the structure parts in which the second covering member 50 is formed and the figures indicating the structure parts in which the second covering member 50 and the reflective member 70 are formed are mixedly shown. However, it is needless to say that the respective embodiments can take any construction, a construction in which the second covering member 50 is formed on the light-guiding plate 30, 31, a construction in which the second covering member 50 and the reflective member 70 are included in the light-guiding plate 30, 31, and so on.

Further, in the respective embodiments, it is acceptable that the light-emitting device is constructed including the widened portions 21c, 22c and including the insulating film 60a and/or the auxiliary insulating film 60b.

Although the present disclosure has been described with reference to several exemplary embodiments, it shall be understood that the words that have been used are words of description and illustration, rather than words of limitation. Changes may be made within the purview of the appended claims, as presently stated and as amended, without departing from the scope and spirit of the disclosure in its aspects. Although the disclosure has been described with reference to particular examples, means, and embodiments, the disclosure may be not intended to be limited to the particulars disclosed; rather the disclosure extends to all functionally equivalent structures, methods, and uses such as are within the scope of the appended claims.

One or more examples or embodiments of the disclosure may be referred to herein, individually and/or collectively, by the term "disclosure" merely for convenience and without intending to voluntarily limit the scope of this application to any particular disclosure or inventive concept. Moreover, although specific examples and embodiments have been illustrated and described herein, it should be appreciated that any subsequent arrangement designed to achieve the same or similar purpose may be substituted for the specific examples or embodiments shown. This disclosure may be intended to cover any and all subsequent adaptations or variations of various examples and embodiments. Combinations of the above examples and embodiments, and other examples and embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure may be not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter shall be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure may be determined by the broadest permissible interpretation of the following claims and their equivalents and shall not be restricted or limited by the foregoing detailed description.

The invention claimed is:

1. A method for manufacturing a light-emitting device, the method comprising:
   preparing an intermediate product, the intermediate product comprising a light-emitting element provided with paired electrodes at a first surface, and a first covering member covering the light-emitting element such that portions of surfaces of the paired electrodes are exposed;
   forming a metal paste layer continuously covering the exposed portion of the paired electrodes and the first covering member; and
   forming paired wirings for preventing the paired electrodes from being short-circuited by irradiating the metal paste layer on the paired electrodes and the metal paste layer on the first covering member with laser light to remove the metal paste layer between the paired electrodes and a portion of the metal paste layer on the first covering member,
   wherein a thickness of the metal paste layer formed in the step of forming a metal paste layer is at least 1 µm.

2. The method for manufacturing a light-emitting device according to claim 1, wherein the forming paired wirings comprises irradiating with the laser light having a width smaller than a distance between the paired electrodes.

3. The method for manufacturing a light-emitting device according to claim 1, wherein the forming a metal paste layer comprises forming the metal paste layer by printing or spray coating.

4. The method for manufacturing a light-emitting device according to claim 1,
   wherein, in the providing the intermediate product, the first covering member is disposed between the paired electrodes on the first surface of the light-emitting element, and
   wherein, in the forming the paired wirings, the first covering member disposed between the paired electrodes on the first surface of the light-emitting element is partially removed by the laser light.

5. The method for manufacturing a light-emitting device according to claim 1, wherein, in the preparing the intermediate product, the paired electrodes of the light-emitting element are recognized, and wherein, in the forming the paired wirings, the laser light is applied between the paired electrodes of the light-emitting element recognized in the step of preparing an intermediate product.

6. The method for manufacturing a light-emitting device according to claim 1, wherein, in the preparing the intermediate product, the at least one light-emitting element comprises multiple light-emitting elements, wherein, in the forming the metal paste layer, each of the light-emitting elements is continuously covered, and wherein, in the forming the wirings, the light-emitting elements are electrically connected.

7. The method for manufacturing a light-emitting device according to claim 1, wherein, in the step of preparing an intermediate product, the light-emitting element comprises a first light-transmissive member disposed on second surface opposite to the first surface, the first light-transmissive member being disposed in a through-hole and being provided with a light-reflective film thereon.

8. The method for manufacturing a light-emitting device according to claim 1, further comprising covering at least the paired electrodes with an insulating member after the forming of the paired wirings.

9. The method for manufacturing a light-emitting device according to claim 8, wherein, in the step of covering the paired electrodes with an insulating member, the insulating member is colored.

10. The method for manufacturing a light-emitting device according to claim 1, wherein the metal paste layer used in the forming the metal paste layer comprises a resin in a metal powder.

11. The method for manufacturing a light-emitting device according to claim 10, wherein the metal powder comprises at least one of a silver powder, a copper powder, or a silver or a copper powder coated with a metal.

12. The method for manufacturing a light-emitting device according to claim 10, wherein a concentration of the metal powder in the metal paste layer used in the step of forming a metal paste layer is 60 wt % to 95 wt %.

13. The method for manufacturing a light-emitting device according to claim 10, wherein the metal powder comprises particles of 0.01 μm to 10 μm.

14. The method for manufacturing a light-emitting device according to claim 1, wherein, in the preparing the intermediate product, a first light-transmissive member is disposed on a second surface opposite to the first surface of the light-emitting element, and wherein, in the preparing the intermediate product, the first light-transmissive member is disposed on a light-guiding plate.

15. The method for manufacturing a light-emitting device according to claim 14, wherein the light-guiding plate comprises first recesses each accommodating the light-emitting element and second recesses each disposed between the adjacent first recesses, wherein a reflective member is disposed in each second recess, wherein a second covering member covers the reflective member, wherein the wirings are disposed on the second covering member, and wherein the wiring disposed on the second recess comprise a portion wider than the wiring disposed on the first recess.

16. The method for manufacturing a light-emitting device according to claim 14, wherein the light-guiding plate comprises first recesses and second recesses each disposed between the adjacent first recesses, wherein a reflective member is disposed in the second recess and the wirings are disposed on the second covering member, and wherein, in a recess caused by shrinkage in curing of the reflective member and the second covering member, an auxiliary wiring is formed over the wiring.

17. The method for manufacturing a light-emitting device according to claim 14, wherein the light-guiding plate comprises first recesses, in which the light-emitting elements are disposed, and second recesses each disposed between the adjacent first recesses, and a light-reflective film is arranged on a surface of the light-guiding plate, and wherein the wirings are formed on a wiring substrate having a wiring layer and electrically connected to the paired electrodes of the light-emitting element.

18. The method for manufacturing a light-emitting device according to claim 14, wherein the light-guiding plate comprises first recesses each provided with the light-emitting element and second recesses each disposed between the adjacent first recesses, a second covering member being disposed in each second recess to form a sag due to shrinkage in curing of the second covering member, and the paired wirings being disposed on the second covering member, and wherein, after the step of forming paired wirings, an insulating film and an auxiliary insulating member are disposed in such a way that the insulating film covers at least a portion of the paired wirings and the second covering member, and that the auxiliary insulating film covers the insulating film at a position corresponding to the sag.

19. A method for manufacturing a light-emitting device, the method comprising:

preparing an intermediate product, the intermediate product comprising a light-emitting element provided with paired electrodes at a first surface, and a first covering member covering the light-emitting element such that portions of surfaces of the paired electrodes are exposed;

forming a metal paste layer continuously covering the exposed portion of the paired electrodes and the first covering member; and forming paired wirings for preventing the paired electrodes from being short-circuited by irradiating the metal paste layer on the paired electrodes and the metal paste layer on the first covering member with laser light to remove the metal paste layer between the paired electrodes and a portion of the metal paste layer on the first covering member, wherein, in the providing the intermediate product, the first covering member is disposed between the paired electrodes on the first surface of the light-emitting element, and wherein, in the forming the paired wirings, the first covering member disposed between the paired electrodes on the first surface of the light-emitting element is partially removed by the laser light.

20. A method for manufacturing a light-emitting device, the method comprising:

preparing an intermediate product, the intermediate product comprising a light-emitting element provided with paired electrodes at a first surface, and a first covering member covering the light-emitting element such that portions of surfaces of the paired electrodes are exposed;

forming a metal paste layer continuously covering the exposed portion of the paired electrodes and the first covering member; and forming paired wirings for preventing the paired electrodes from being short-circuited by irradiating the metal paste layer on the paired electrodes and the metal paste layer on the first covering member with laser light to remove the metal paste layer between the paired electrodes and a portion of the metal paste layer on the first covering member, wherein, in the preparing the intermediate product, the paired electrodes of the light-emitting element are recognized, and wherein, in the forming the paired wirings, the laser light is applied between the paired electrodes of the light-emitting element recognized in the step of preparing an intermediate product.

* * * * *